(12) United States Patent
Yamazaki et al.

(10) Patent No.: US 8,735,899 B2
(45) Date of Patent: May 27, 2014

(54) LIGHT-EMITTING DEVICE AND DISPLAY DEVICE

(75) Inventors: Shunpei Yamazaki, Tokyo (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/612,986

(22) Filed: Sep. 13, 2012

(65) Prior Publication Data

US 2013/0012272 A1 Jan. 10, 2013

Related U.S. Application Data

(60) Continuation of application No. 13/047,009, filed on Mar. 14, 2011, now Pat. No. 8,497,516, which is a division of application No. 12/260,788, filed on Oct. 29, 2008, now Pat. No. 8,106,407, and a continuation of application No. 11/634,092, filed on Dec. 6, 2006, now Pat. No. 7,453,089, which is a division of application No. 10/616,204, filed on Jul. 10, 2003, now Pat. No. 7,189,999, which is a division of application No. 09/929,264, filed on Aug. 15, 2001, now Pat. No. 6,605,826.

(30) Foreign Application Priority Data

Aug. 18, 2000 (JP) .................................. 2000-248983
Aug. 29, 2000 (JP) .................................. 2000-259968

(51) Int. Cl.
*H01L 27/14* (2006.01)

(52) U.S. Cl.
USPC .............................. 257/72; 257/59; 257/258

(58) Field of Classification Search
USPC ............................................. 257/59, 72, 258
See application file for complete search history.

(56) References Cited

U.S. PATENT DOCUMENTS 4,356,429 A 10/1982 Tang et al.
4,539,507 A 9/1985 Vanslyke et al.
(Continued)

FOREIGN PATENT DOCUMENTS

EP 0 717 445 A2 6/1996
EP 0 781 075 A1 6/1997
(Continued)

OTHER PUBLICATIONS

M.A. Baldo et al., "Very High-Efficiency Green Organic Light-Emitting Devices Based on Electrophosphorescence", Applied Physics Letters; vol. 75, No. 1; Jul. 5, 1999; pp. 4-6.

(Continued)

*Primary Examiner* — Tan N Tran
(74) *Attorney, Agent, or Firm* — Nixon Peabody LLP; Jeffrey L. Costellia

(57) ABSTRACT

Although an organic resin substrate is highly effective at reducing the weight and improving the shock resistance of a display device, it is required to improve the moisture resistance of the organic resin substrate for the sake of maintaining the reliability of an EL element. Hard carbon films are formed to cover a surface of the organic resin substrate and outer surfaces of a sealing member. Typically, DLC (Diamond like Carbon) films are used as the carbon films. The DLC films have a construction where carbon atoms are bonded into an $SP^3$ bond in terms of a short-distance order, although the films have an amorphous construction from a macroscopic viewpoint. The DLC films contain 95 to 70 atomic % carbon and 5 to 30 atomic % hydrogen, so that the DLC films are very hard and minute and have a superior gas barrier property and insulation performance.

23 Claims, 22 Drawing Sheets

(56) References Cited

U.S. PATENT DOCUMENTS

| | | | |
|---|---|---|---|
| 4,720,432 A | 1/1988 | Vanslyke et al. | |
| 4,769,292 A | 9/1988 | Tang et al. | |
| 4,885,211 A | 12/1989 | Tang et al. | |
| 4,950,950 A | 8/1990 | Perry et al. | |
| 5,047,687 A | 9/1991 | Vanslyke | |
| 5,059,861 A | 10/1991 | Littman et al. | |
| 5,059,862 A | 10/1991 | Vanslyke et al. | |
| 5,061,617 A | 10/1991 | Maskasky | |
| 5,073,446 A | 12/1991 | Scozzafava et al. | |
| 5,107,175 A | 4/1992 | Hirano et al. | |
| 5,124,204 A | 6/1992 | Yamashita et al. | |
| 5,151,629 A | 9/1992 | Vanslyke | |
| 5,189,405 A | 2/1993 | Yamashita et al. | |
| 5,276,537 A * | 1/1994 | Savant et al. | 359/3 |
| 5,294,869 A | 3/1994 | Tang et al. | |
| 5,294,870 A | 3/1994 | Tang et al. | |
| 5,579,137 A | 11/1996 | Shimizu | |
| 5,610,742 A * | 3/1997 | Hinata et al. | 349/122 |
| 5,629,783 A | 5/1997 | Kanbara et al. | |
| 5,686,360 A | 11/1997 | Harvey, III et al. | |
| 5,693,956 A | 12/1997 | Shi et al. | |
| 5,711,824 A | 1/1998 | Shinohara et al. | |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,869,929 A | 2/1999 | Eida et al. | |
| 5,952,778 A | 9/1999 | Haskal et al. | |
| 5,962,962 A | 10/1999 | Fujita et al. | |
| 6,040,520 A | 3/2000 | Morooka et al. | |
| 6,064,137 A | 5/2000 | Cox | |
| 6,085,112 A | 7/2000 | Kleinschmidt et al. | |
| 6,146,225 A | 11/2000 | Sheats et al. | |
| 6,148,075 A * | 11/2000 | Inubushi et al. | 379/368 |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,219,127 B1 | 4/2001 | Hirakata et al. | |
| 6,228,228 B1 | 5/2001 | Singh et al. | |
| 6,268,071 B1 | 7/2001 | Yasukawa et al. | |
| 6,268,235 B1 | 7/2001 | Sakakura et al. | |
| 6,274,887 B1 | 8/2001 | Yamazaki et al. | |
| 6,274,978 B1 | 8/2001 | Roach et al. | |
| 6,287,888 B1 | 9/2001 | Sakakura et al. | |
| 6,323,892 B1 | 11/2001 | Mihara | |
| 6,366,025 B1 * | 4/2002 | Yamada | 315/169.3 |
| 6,413,645 B1 | 7/2002 | Graff et al. | |
| 6,432,561 B1 | 8/2002 | Yamazaki | |
| 6,445,005 B1 | 9/2002 | Yamazaki et al. | |
| 6,580,094 B1 | 6/2003 | Yamazaki et al. | |
| 6,614,905 B1 | 9/2003 | Kristensen | |
| 6,620,528 B1 | 9/2003 | Yamazaki et al. | |
| 6,631,192 B1 | 10/2003 | Fukiharu | |
| 6,641,933 B1 | 11/2003 | Yamazaki et al. | |
| 6,653,657 B2 | 11/2003 | Kawasaki et al. | |
| 6,776,880 B1 | 8/2004 | Yamazaki | |
| 6,821,827 B2 | 11/2004 | Nakamura et al. | |
| 6,825,829 B1 | 11/2004 | Albert et al. | |
| 6,830,494 B1 | 12/2004 | Yamazaki et al. | |
| 6,909,114 B1 | 6/2005 | Yamazaki | |
| 6,956,324 B2 | 10/2005 | Yamazaki | |
| 7,189,999 B2 | 3/2007 | Yamazaki et al. | |
| 7,279,711 B1 * | 10/2007 | Yamazaki et al. | 257/69 |
| 7,402,467 B1 | 7/2008 | Kadono et al. | |
| 7,854,640 B2 | 12/2010 | Yamazaki | |
| 8,106,407 B2 * | 1/2012 | Yamazaki et al. | 257/81 |
| 8,497,509 B2 | 7/2013 | Yamazaki et al. | |
| 8,497,516 B2 * | 7/2013 | Yamazaki et al. | 257/81 |
| 2001/0017604 A1 * | 8/2001 | Jacobsen et al. | 345/27 |
| 2001/0033135 A1 | 10/2001 | Duggai et al. | |
| 2002/0018060 A1 | 2/2002 | Yamazaki et al. | |
| 2002/0053379 A1 * | 5/2002 | Tokas et al. | 152/209.6 |
| 2002/0125817 A1 | 9/2002 | Yamazaki et al. | |
| 2003/0137061 A1 | 7/2003 | Bailey et al. | |

FOREIGN PATENT DOCUMENTS

| | | | |
|---|---|---|---|
| EP | 0 899 987 | | 3/1999 |
| EP | 0 999 595 | A2 | 5/2000 |
| EP | 1 058 314 | A2 | 12/2000 |
| EP | 1 058 484 | A1 | 12/2000 |
| JP | 64-043993 | | 2/1989 |
| JP | 06-325868 | | 11/1994 |
| JP | 08-078159 | | 3/1996 |
| JP | 08-241048 | | 9/1996 |
| JP | 10-189252 | | 7/1998 |
| JP | 10-261487 | | 9/1998 |
| JP | 11-144864 | | 5/1999 |
| JP | 11-214152 | | 8/1999 |
| JP | 11-297477 | * | 10/1999 |
| JP | 2000-036985 | | 2/2000 |
| JP | 2000-133440 | | 5/2000 |

OTHER PUBLICATIONS

Tetsuo Tsutsui et al. "Electroluminescence in Organic Thin Films"; Photochemical Processes in Organized Molecular Systems; 1991; pp. 437-450.

Tetsuo Tsutsui et al. "High Quantum Efficiency in Organic Light-Emitting Devices with Iridium-Complex as a Triplet Emissive Center"; Jpn. J. Appl. Phys. vol. 38, Part 2, No. 12B, Dec. 15, 1999; pp. L1502-L1504.

M.A. Baldo et al. "Highly Efficient Phosphorescent Emission from Organic Electroluminescent Devices"; Letters to Nature; vol. 395; Sep. 10, 1998; pp. 151-154.

* cited by examiner

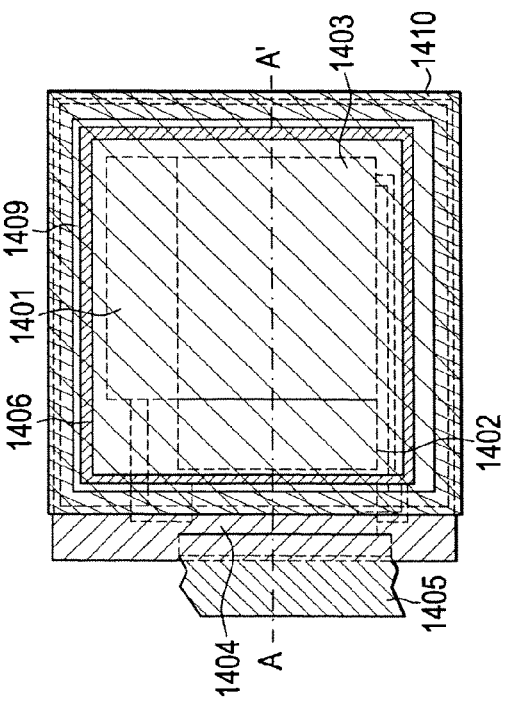
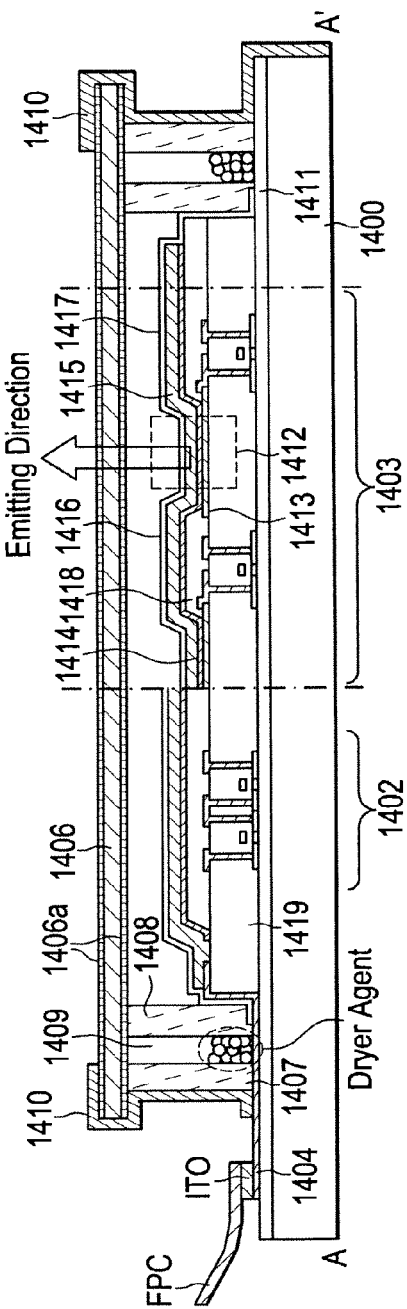
FIG. 14A
FIG. 14B

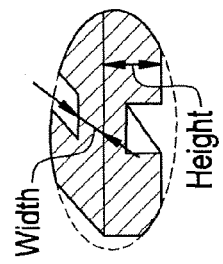
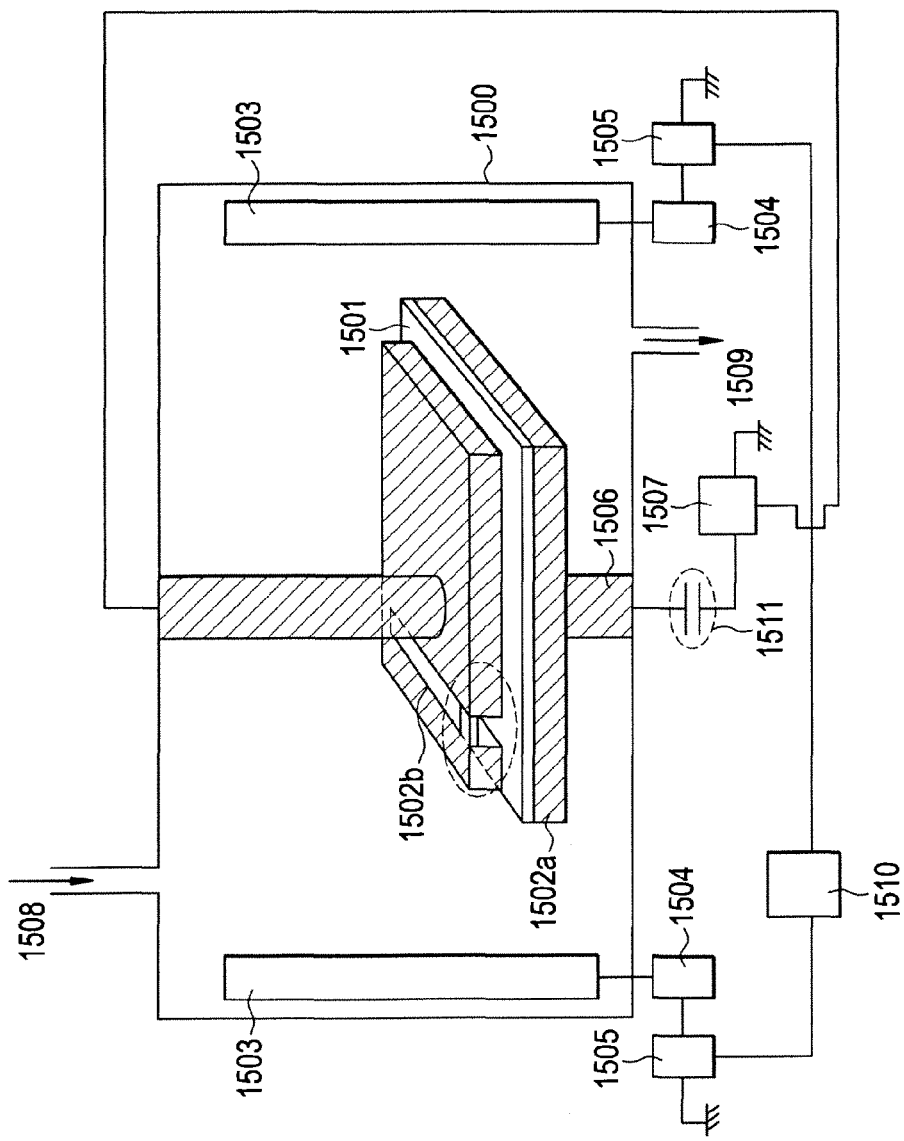

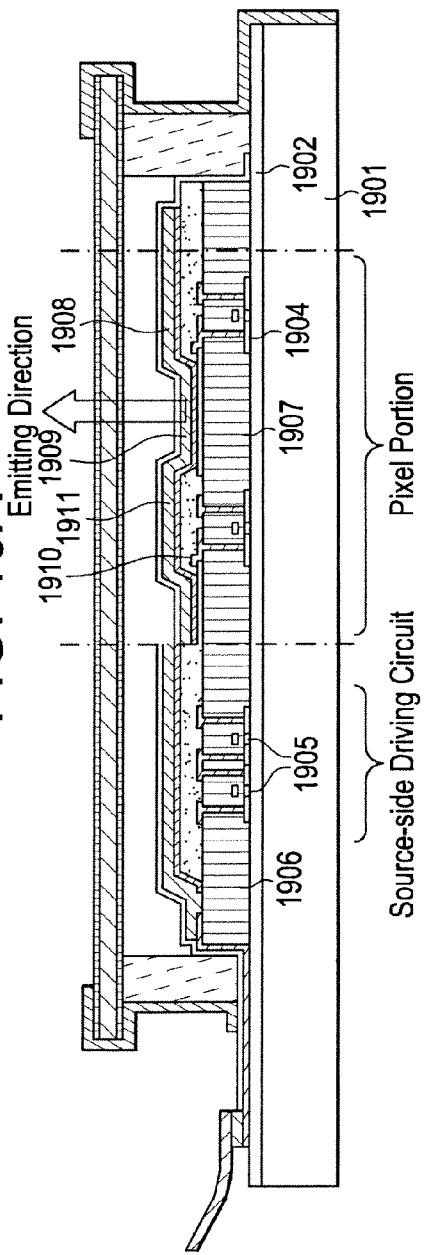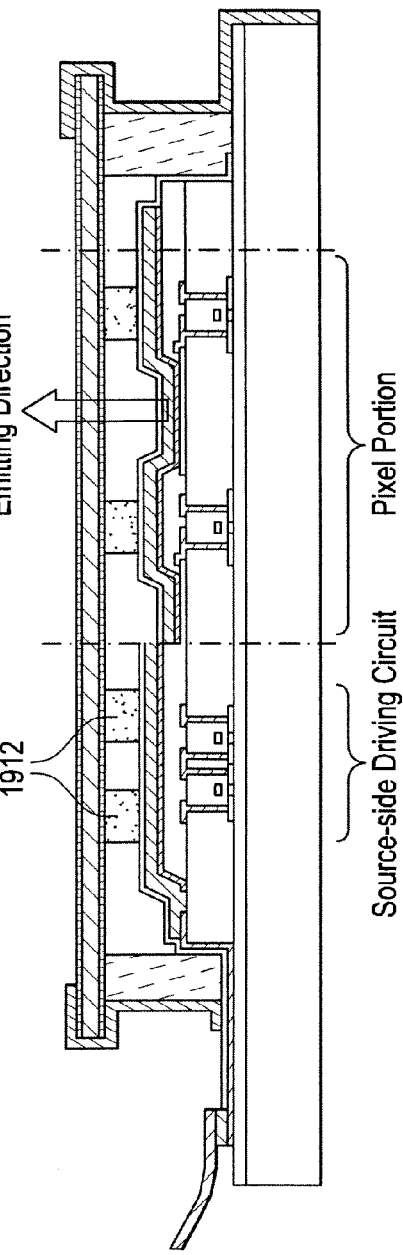

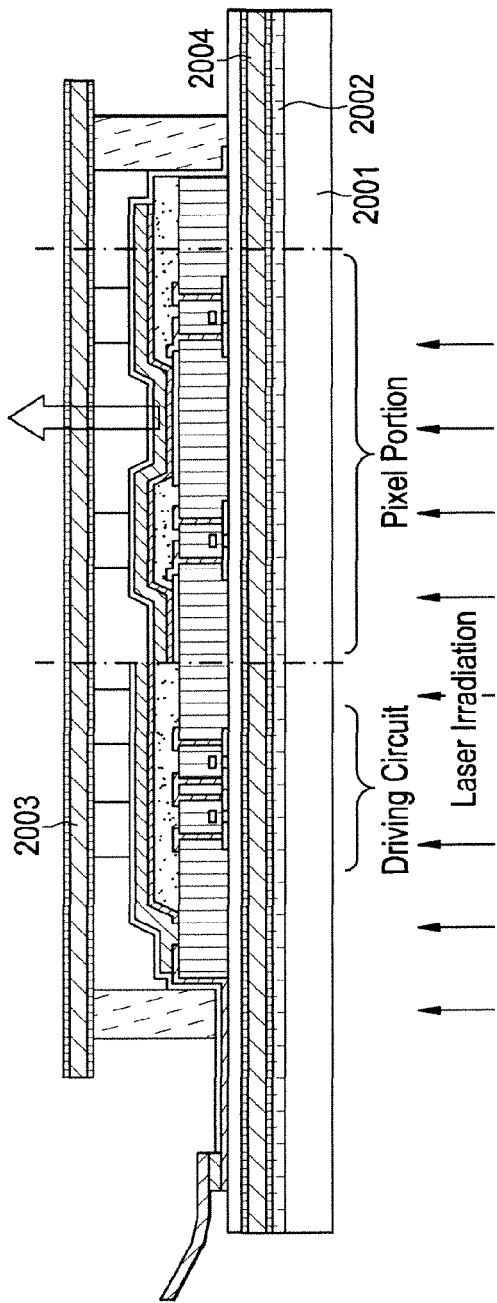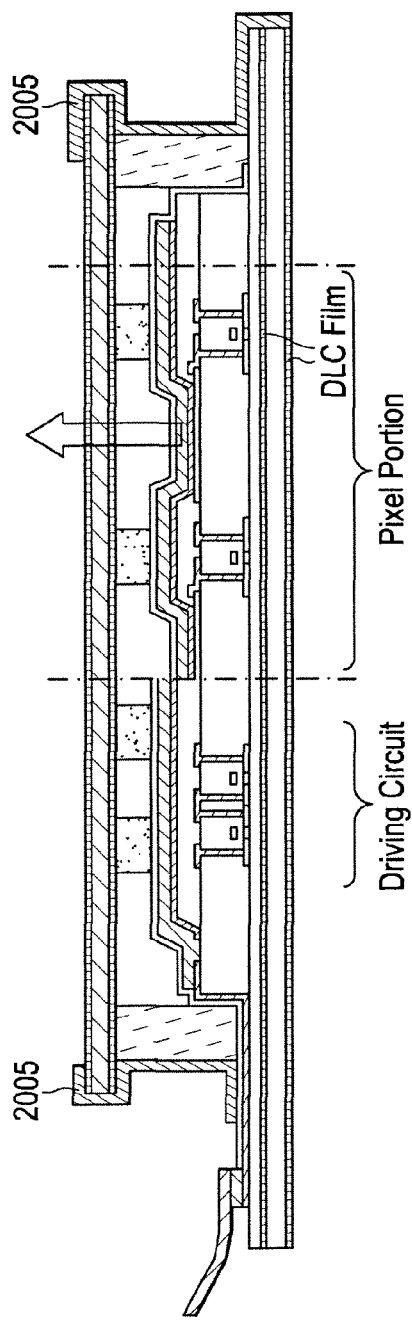

Point at FIG. 23B
Point at FIG. 23D
Point at FIG. 23F
Point at FIG. 23E
DLC Film

LIGHT-EMITTING DEVICE AND DISPLAY DEVICE

BACKGROUND OF THE INVENTION

1. Field of the Invention

The present invention relates to a device (hereinafter referred to as a light-emitting device) that has an element (hereinafter referred to as a light-emitting element) where a thin film including a luminescent material is sandwiched between a pair of an anode electrode and a cathode electrode. In particular, the present invention relates to a light-emitting device whose light-emitting element includes a thin film (hereinafter referred to as a light-emitting layer) made of an electro-luminescent material (EL material). The present invention also relates to a display device that uses a substrate made of an organic resin material and, more particularly, to a display device where a pixel portion is formed on such a substrate using thin-film transistors and an EL material.

2. Description of the Related Art

Liquid crystal panels or EL materials applied to display devices may contribute to reduction in weight and thickness thereof in comparison with conventional CRTs. Therefore, attempts have been recently made to apply display devices using the liquid crystal panels or EL materials to various fields. Also, it has now become possible to connect portable telephones and personal digital assistants (PDAs) to the Internet, which leads to the dramatic increase in the amount of image information to be displayed thereon and creates increasing demand for high-definition color display devices.

Display devices used for such portable information terminals need to be reduced in weight and, for instance, portable telephones whose weights are below 70 g are now on the market. For the reduction in weight, almost all components, such as electronic components, housing, and batteries, of the portable information terminals are subjected to reengineering. For the further weight reduction, however, display devices need to be reduced in weight.

Display devices are produced using glass substrates in many cases, so that one conceivable method for weight reduction would be to reduce the thickness of the glass substrates. In this case, however, the glass substrates tend to be cracked and the shock resistance thereof is lowered. This becomes a serious hindrance to the application of display devices including such thin glass substrates to portable information terminals. To meet demand for weight reduction as well as shock resistance, the development of display devices using organic resin substrates (plastic substrates) is under consideration.

For instance, light-emitting devices that have light-emitting elements produced using EL materials are currently under development. Display devices whose pixel portions are formed using light-emitting elements are capable of emitting light by themselves and further do not require light sources, such as backlights, unlike liquid crystal display devices. As a result, such light-emitting elements are highly expected as an effective means for reducing weights as well as thickness of display devices.

The construction of a typical light-emitting element using an organic EL material is shown in FIG. 22. In this drawing, an insulator 2201, an anode 2202, a light-emitting layer 2203, and a cathode 2204 are laminated to form a light-emitting element 2200.

Before being observed by an observer 2206, light 2205 emitted from the light-emitting layer directly passes through the anode 2202, or is reflected by the cathode 2204 and then passes through the anode 2202. That is, the observer 2206 observes the light 2205 that and passes through the anode 2202 to be emitted in picture elements where the light-emitting layer 2203 performs light emission.

A light-emitting element is composed of two electrodes: an anode that injects holes into an organic compound layer including a light-emitting layer, and a cathode that injects electrons into the organic compound layer. The light-emitting element having this construction utilizes a phenomenon where light is emitted when the holes injected from the anode are recombined with the electrons injected from the cathode within the light-emitting layer. The organic compound layer including the light-emitting layer is degraded by various factors, such as heat, light, moisture, and oxygen. To prevent this degradation, an ordinary active matrix type light-emitting device is produced by forming light-emitting elements in a pixel portion after wiring and semiconductor elements are formed therein.

After the formation of the light-emitting element, a first substrate, on which the light-emitting element have been formed, and a second substrate for covering the light-emitting elements are laminated and sealed (packaged) using a sealing member. This construction prevents the light-emitting elements from being exposed to the outside air.

It should be noted here that in this specification, all layers provided between a cathode and an anode are collectively referred to as an organic compound layer. The organic compound layer has a well-known structure where, for instance, a hole injecting layer, a light-emitting layer, an electron transporting layer, and an electron injecting layer are laminated with each other. A predetermined voltage is applied to the organic compound layer by a pair of electrodes to cause the recombination of carriers, thereby causing light emission in the light-emitting layer.

The light-emitting element, however, has a problem as to durability and, in particular, to oxidation resistance. The cathode that injects electrons into the organic compound layer is ordinarily made of an alkaline metal or an alkaline earth metal having a low work function. It is well known that these metals tend to react with and water, thereby having low oxidation resistance. The oxidation of the cathode means that the material of the cathode loses electrons and is coated with an oxidation layer. The reduction in the number of electrons to be injected and the oxidation coat may reduce the amount of emitted light in brightness.

As described above, the electrode of the light-emitting element is easily oxidized with a considerably small amount of oxygen or moisture and therefore the light-emitting element is easily degraded. Various techniques have been developed to prevent the oxidation of the light-emitting element. For instance, the light-emitting element is sealed with a metal or glass that is impermeable to oxygen and moisture. Also, the light-emitting element is produced to have a resin lamination construction or is filled with nitrogen or an inert gas. Even if the light-emitting element is sealed with a metal or a resin, however, oxygen easily passes through small gaps and oxidizes the cathode and light-emitting layer. Also, moisture easily passes through the resin used to seal the light-emitting element in terms of the light-emitting element. This causes a problem in that areas (called dark spots) that do not emit light appear on a display screen and expand with the lapse of time, which makes the light-emitting element incapable of emitting light.

EL materials are capable of emitting blue light and thus it is possible to realize a full-color display device of a self-Light emitting type with the materials. However, it is confirmed that organic light-emitting elements are degraded in various ways. This degradation prevents the actual use of the EL materials and a solution to this problem is urgently required. The dark spots are spot-shaped defects that do not emit light in the pixel portion and so degrade display quality. The dark spots are also defects that get worse over time. Even if the light-emitting element is not brought into operation, the number of the dark spots is increased by the existence of moisture. It is thought that the cause of the dark spots is the oxidation reaction of the cathode made of an alkaline metal. To prevent the occurrence of dark spots, a sealed space is filled with dryer gas or provided with a dryer agent, in which the light-emitting element is placed.

Also, the light-emitting element is vulnerable to heat that promotes oxidation. This means that there are many factors causing oxidation and therefore it is difficult to make actual use of light-emitting devices. In view of the problems described above, the object of the present invention is to provide a light-emitting device with a high degree of reliability and an electronic device where a high-reliability display unit is achieved using such a light-emitting device.

It is well known that a substrate made of an organic resin material has high permeability to moisture, in comparison with a glass substrate. For instance, the permeability to moisture of polyether imide is 36.5 g/m$^2$·24 hr, that of polyimide is 32.7 g/m$^2$·24 hr, and that of polyether terephthalate (PET) is 12.1 g/m$^2$·24 hr.

As is apparent from this, if a display device produced with a light-emitting element including an organic resin substrate is left standing in the air for a long time period, moisture gradually permeates and the organic light-emitting element is degraded. In addition, a sealing member used to seal a light-emitting element is also made of an organic resin material, so that it is difficult to completely prevent oxygen and moisture in the air from entering through sealed portions.

Also, an organic resin substrate is soft, in comparison with a metal substrate or a glass substrate, so that scratches or the like are easily made thereon. Further, the long-term exposure to the direct sunlight causes a light chemical reaction and alters the quality and color of the organic resin substrate.

As described above, the organic resin substrate is a highly effective means to realize a display device reduced in weight with high shock resistance; although there remain many problems that must be solved in order to ensure the reliability of the light-emitting element. In view of these problems, the object of the present invention is to provide a display device that uses a light-emitting element with a high degree of reliability.

Also, if the outside light (the light existing outside the light-emitting device) enters picture elements that do not emit light, the light is reflected by the back surface (the surface contacting the organic compound layer) of the cathode, so that the cathode back surface functions as a mirror and reflects the outside scenes. To solve this problem, a circular polarizing film has conventionally been applied to a light-emitting device to prevent the reflection of the outside scenes toward the observer, although this construction raises the fabrication cost because the circular polarizing film is high-priced. In view of this problem, the object of the present invention is to prevent this mirror reflection phenomenon of a light-emitting device without using a circular polarizing film.

SUMMARY OF THE INVENTION

According to the present invention, in a display device using an organic resin substrate, a hard carbon film is formed on a surface of the substrate as a protecting film that prevents from entering moisture or the like and the scratches on the surface. In particular, a DLC (Diamond like Carbon) film is used with the present invention. The DLC film has a construction where carbon atoms are bonded into a diamond bond (SP$^3$ bond) in terms of a short-distance order, although the film has an amorphous construction containing a graphite bond (SP$^2$ bond) from a macroscopic viewpoint. The DLC film contains 95 to 70 atomic % carbon and 5 to 30 atomic % hydrogen, so that the DLC film is very hard and excels in insulation. The DLC film is also characterized by low gas permeability to moisture and oxygen. Further, it is known that the hardness of the DLC film is 15 to 25 Gpa in the case of measurement using a micro-hardness meter.

The DLC film is formed using a plasma CVD method, a microwave CVD method, an electron cyclotron resonance (ECR) CVD method, or a sputtering method. With any of these methods, the DLC film is formed in intimate contact without heating the organic resin substrate. The DLC film is formed under a situation where the substrate is set on a cathode. Alternatively, the DLC film is formed by applying a negative bias and utilizing ion bombardment to some extent. In the latter case, the DLC film becomes minute and hard.

The reaction gas used to form the DLC film is hydrocarbon gas, such as $CH_4$, $C_2H_2$, and $C_6H_6$. The DLC film is formed by ionizing the reaction gas by means of glow discharge and bombarding a cathode, to which a negative self-bias is applied, with accelerated ions. In this manner, the DLC film becomes minute and flat. The DLC film may be formed without heating the substrate to a high temperature, so that the formation of the DLC film can be performed in the final manufacturing step where a display device is finished.

By forming the DLC film on at least one surface of the organic resin substrate, the gas barrier property is improved. Alternatively, the gas barrier property is improved by forming the DLC film on the outer surface of a sealing member used to laminate an organic resin substrate (hereinafter, an element substrate), on which TFTs and light-emitting elements are formed, with a sealing substrate for sealing the light-emitting elements. In this case, the thickness of the DLC film is in a range of 5 nm to 500 nm. Also, by forming the DLC film on a light incident surface, ultraviolet rays are blocked, the light chemical reaction of the organic resin substrate is suppressed, and the degradation of the organic resin substrate is prevented.

The DLC film that prevents oxygen and moisture from entering is formed to successively cover exposed portions of the sealing member and side portions of the first and second substrates that are laminated to produce the light-emitting device. The exposed portions of the sealing member and the side portions of the first and second substrates are hereinafter collectively referred to as "end surfaces". With a conventional technique, oxygen and moisture pass through a resin provided at end portions. The construction described above, however, prevents moisture from entering through between the first and second substrates.

A dryer agent is provided in a space between the element substrate and the sealing substrate sealed by the sealing member, thereby suppressing the degradation of the light-emitting elements. For instance, a barium oxide can be used as the dryer agent. The dryer agent is provided at positions (for instance, on a driving circuit, on a partition wall, or within the partition wall) outside light-emitting areas. With this construction, the dryer agent absorbs gas and moisture contained in the light-emitting elements as well as oxygen and moisture passing through a sealing resin in the end portions. As a result, the degradation of the light-emitting elements is prevented. Further, by forming an organic interlayer insulating film using a black resin, the mirror reflection phenomenon (the reflection of the outside scenes) of the light-emitting device is prevented. Also, the black resin may be used in an area in which the sealing member is formed.

The DLC film described above is applicable to passive type display devices as well as active matrix type display devices.

BRIEF DESCRIPTION OF THE DRAWINGS

In the accompanying drawings:

FIGS. 14A and 14B each show an embodiment mode of the present invention;

FIGS. 15A and 15B each show a CVD apparatus of the present invention;

FIGS. 19A and 19B each show an example of the embodiment mode of the present invention;

FIGS. 20A and 20B each show an example of the embodiment mode of the present invention;

DETAILED DESCRIPTION OF THE PREFERRED EMBODIMENTS

Embodiment modes and embodiments of the present invention are described in detail below with reference to the drawings.

Embodiment Mode 1

Figure 1A:
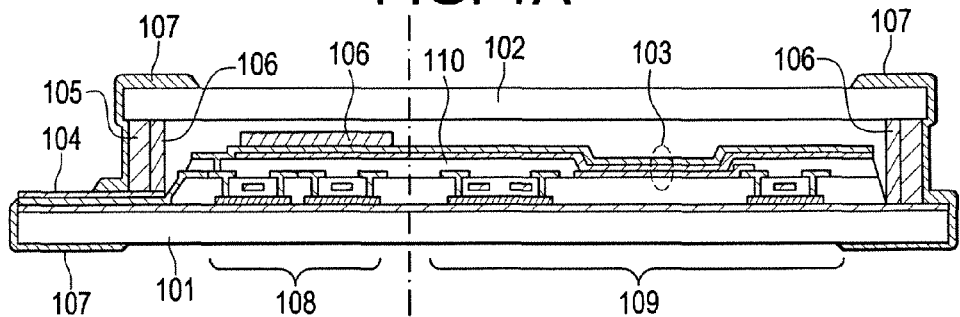
FIGS. 1A to 1D each show a position where DLC film is formed on an organic resin substrate according to the present invention.

Embodiment Mode 1 is described below with reference to FIGS. 1A to 1D each showing a display device using a light-emitting element. FIG. 1A shows a state where an element substrate 101, on which a driving circuit 108 and a pixel portion 109 are formed using TFTs (thin-film transistors) and a sealing substrate 102 are fixed using a sealing member 105. A light-emitting element 103 is formed in the sealed space formed between the element substrate 101 and the sealing substrate 102. A dryer agent 106 is provided on the driving circuit or in the vicinity of the sealing member 105. It should be noted here that although not shown in this drawing, the dryer agent 106 may be contained in a partition wall 110 that is formed across the pixel portion 109 and the driving circuit 108.

Each of the element substrate and sealing substrate is made of an organic resin material, such as polyimide, polyethylene terephthalate (PET), polyethylene naphthalate (PEN), polyether sulfone (PES), or aramid. The thickness of each of these substrates is set at around 30 to 120 μm to maintain the flexibilities of the substrates.

In the example shown in FIG. 1A, DLC films 107 are formed at end portions as gas barrier layers. Note that the DLC films are not formed on art external input terminal 104. An epoxy adhesive is used as the sealing member. To prevent from entering moisture, the DLC films 107 are formed to cover the sealing member 105 and the end portions of the element substrate 101 and the sealing substrate 102.

Figure 1B:
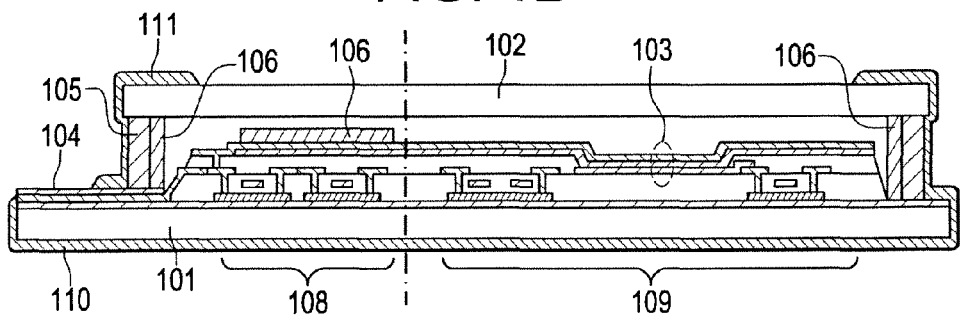

FIG. 1B shows a construction where a DLC film 110 is formed to cover the undersurface of the element substrate 101, in addition to the DLC films 107 formed to cover the sealing member 105 and the end portions of the substrates 101 and 102. Although depending on the thickness, a DLC film has low permeability to light whose wavelength is short (500 nm or less). Therefore, in this example, no DLC film is formed on the display surface (the main surface on a display side) of the sealing substrate 102. This construction, however, completely prevents moisture from entering the element substrate 101 on which the TFTs are formed. As a result, the degradation of the TFTs and the light-emitting element does not occur.

Figure 1C:
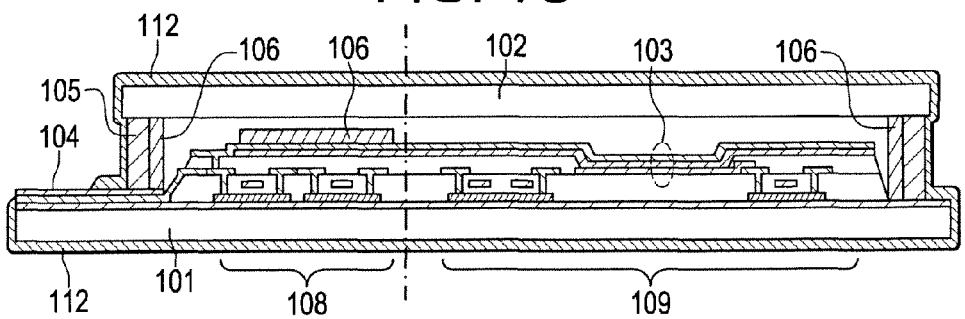

FIG. 1C shows a construction where gas barrier property is improved. In this drawing, a DLC film is formed to cover whole surfaces of the element substrate 101, the sealing substrate 102, and the sealing member 105, except for the external input terminal 104. In addition to the improvement in gas barrier property, this construction has the effect of preventing scratches or the like on the surfaces because the surfaces of the plates are protected by the DLC film.

Figure 1D:
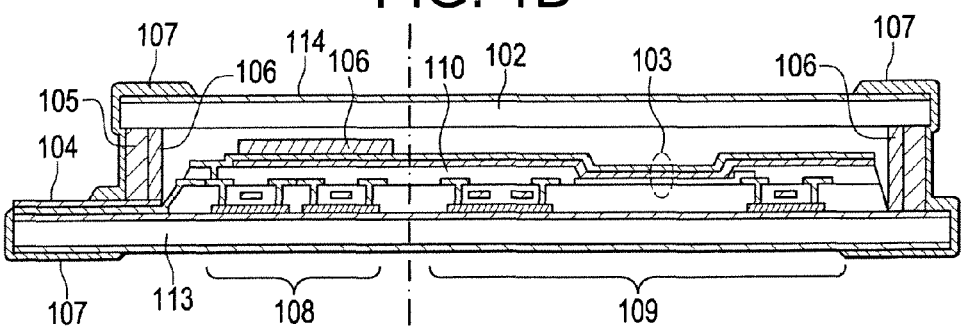

FIG. 1D shows an example where DLC films are formed on the element substrate 113 and the sealing substrate 114 beforehand. Then, other DLC films are additionally formed to cover the end portions in which the sealing member for fixing these plates is formed.

Figure 2:
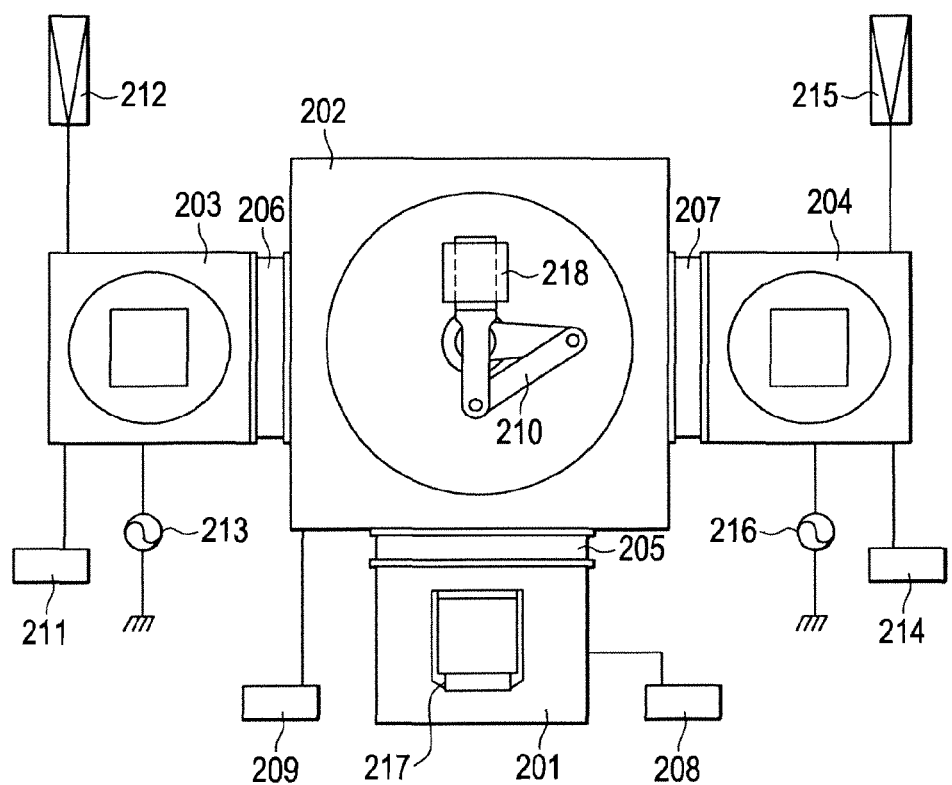
FIG. 2 shows the construction of a plasma CVD apparatus used to form DLC films used in the present invention.

FIG. 2 shows an example of a CVD apparatus used to form DLC films. This drawing mainly shows a vacuum chamber and other related processing means. As shown in this drawing, the vacuum chamber includes a common chamber 202 that has a transporting means for transporting a target substrate 218 to be processed, a load lock chamber 201 that inserts and removes the target substrate, and a first reaction chamber 203 and a second reaction chamber 204 that form DLC films on the target substrate. The load lock chamber 210 and the first and second reaction chambers 203 and 204 are connected to the common chamber 202 via gate valves 205 to 207. Also, these chambers 201 to 204 are provided with exhausting means 208, 209, 211, and 214.

The first reaction chamber 203 is provided with a gas introducing means 212 and a discharge causing means 213. Similarly, the second reaction chamber 204 is provided with a gas introducing means 213 and a discharge causing means 216. These gas introducing means introduce above-described hydrocarbon gas or Ar, H₂ and the like into the chambers. Each discharge causing means is composed of a cathode and an anode, which are arranged in respective reaction chambers, and a high-frequency (1 to 120 MHz) power source. DLC films are formed by setting the target substrate on the cathode side in the reaction chamber. Therefore, if DLC films are to be formed on both of the element substrate and the sealing substrate, as shown in FIG. 1C, the posture of the target substrate need to be changed (for instance, the target substrate is required to be turned around).

Figure 3A:
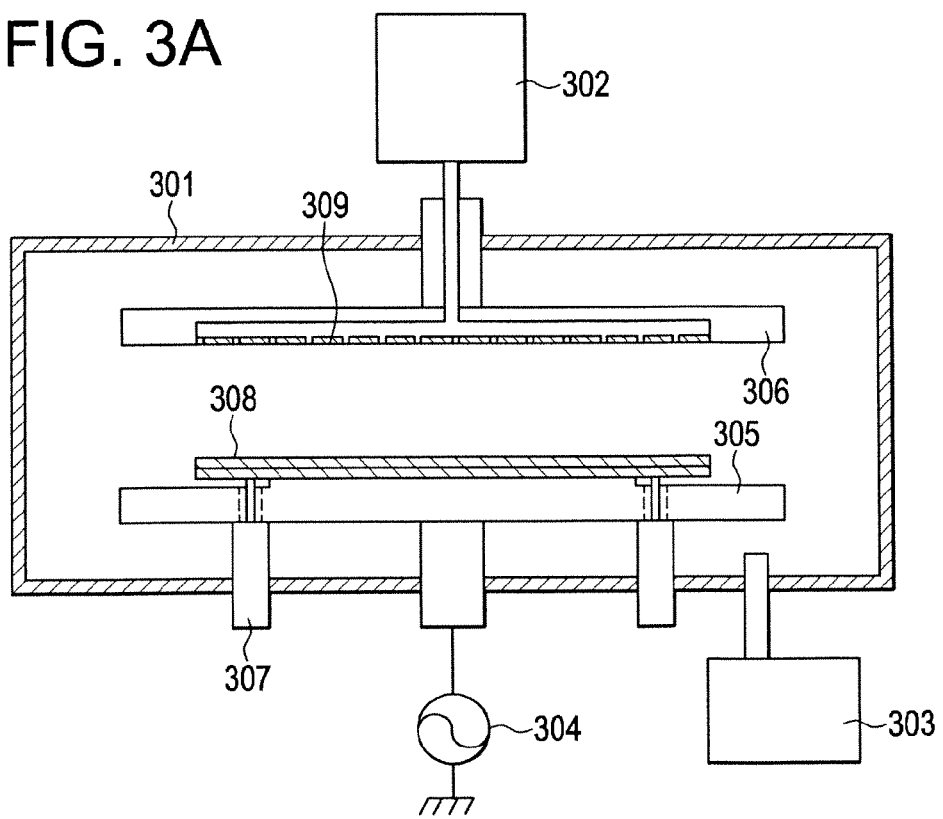
FIGS. 3A and 3B each show the construction of the reaction chamber of the plasma CVD apparatus.
Figure 3B:
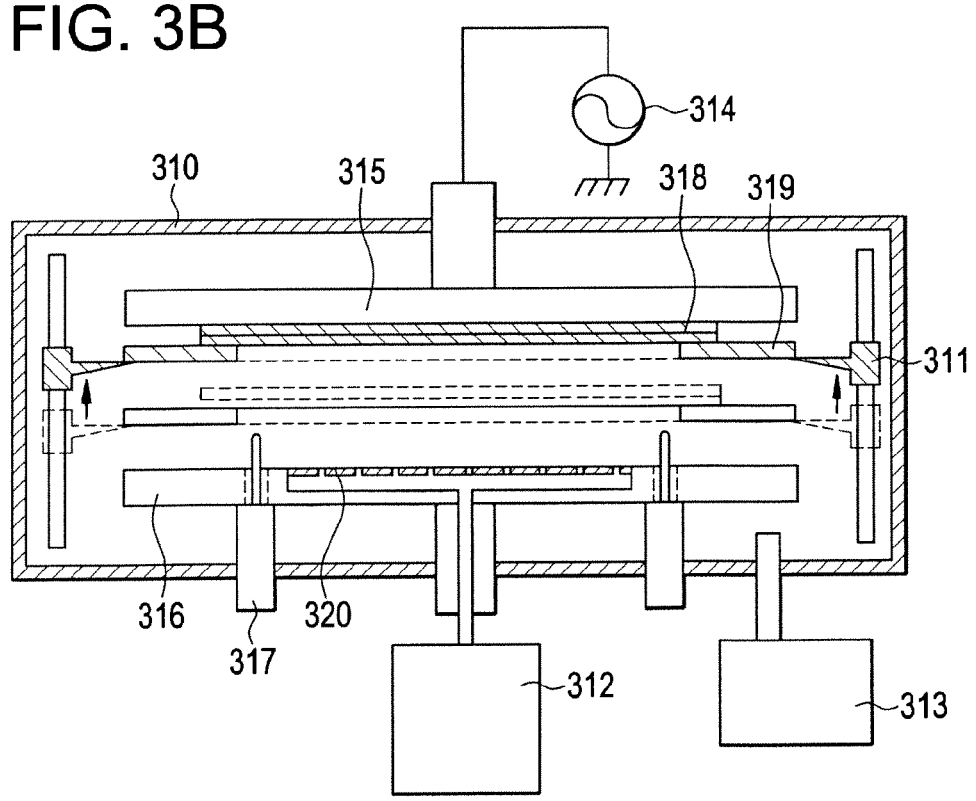

FIGS. 3A and 3B each show a state where a DLC film is formed on one surface of the target substrate in the first reaction chamber 203 and another DLC film is formed on the other surface of the target substrate in the second reaction chamber 204.

In FIG. 3A, a reaction chamber 301 is connected to a gas introducing means 302 and includes a cathode 305, to which a high-frequency power source 304 is connected, and an anode 306 having a shower plate 309 for supplying gas to the reaction chamber. The reaction chamber 301 is also connected to an exhausting means 303. A target substrate 308 is placed on the cathode 305. Pressure pins 307 are used to transport the target substrate. With this construction, a DLC film is formed on one-surface and end portions of the target substrate in the reaction chamber. Also, if the cathode has a stepped cross section, as shown in FIG. 3A, it becomes possible to have the formed DLC film also cover undersurface areas in the vicinity of the end portions of the target substrate. Needless to say, the DLC film covering the undersurface areas is thinner than that covering other areas.

FIG. 3B shows a example of construction of a reaction chamber where a DLC film is formed on a surface opposing to that processed in FIG. 3A (the undersurface of the target substrate). A reaction chamber 310 is connected to a gas introducing means 312 and includes a cathode 315, to which a high-frequency power source 314 is connected, and an anode 316 having a shower plate 320 for supplying gas to the reaction chamber 310. The reaction chamber 310 is also connected to an exhausting means 313. A target substrate 318 is required to be set at the cathode 315, so that the reaction chamber 310 is further provided with a holder 319 and a mechanism 311 for moving the holder up or down. The target substrate 318 is first held by pressure pins 317 and then is set at the cathode 315 by the holder 319 that is elevated by the mechanism 311. In this manner, a DLC film is formed on the surface opposing to that processed in FIG. 3A (the undersurface of the target substrate).

As described above, with the plasma CVD apparatus shown in FIGS. 2, 3A, and 3B, it becomes possible to realize the display devices shown in FIGS. 1A to 1D where DLC films are formed as gas barrier layers. Needless to say, FIGS. 2, 3A, and 3B each show an example construction of the CVD apparatus, so that the display devices shown in FIGS. 1A to 1D may be produced with a film forming apparatus having another construction. For instance, DLC films may be formed with a CVD apparatus that utilizes a microwave or electron cyclotron resonance.

The DLC films used as gas barrier layers more effectively prevent moisture and oxygen from entering a sealed space and thus enhances the stability of a light-emitting element. For instance, this construction reduces the number of dark spots resulting from the oxidation of a cathode.

Embodiment Mode 2

FIGS. 14A and 14B each show an example where a pixel portion and a driving circuit are formed on a substrate having an insulating surface (such as a glass substrate, a ceramic substrate, a crystallized glass substrate, a metal substrate, or a plastic substrate).

In these drawings, reference numeral 1401 represents a gate-side driving circuit; numeral 1402, a source-side (data-side) driving circuit; and numeral 1403, a pixel portion. Signals transmitted to the gate-side driving circuit 1401 and the source-side driving circuit 1402 are supplied from an FPC (flexible print circuit) 1405 via input wiring 1404.

A sealing substrate 1406 is used to seal light-emitting elements. The light-emitting elements emit light toward the sealing substrate 1406, so that the sealing substrate 1406 is required to have transparency. Numeral 1407 represents a sealing resin used to seal the sealing substrate 1406 and the element substrate 1400. A cross-sectional view taken along the line A-A' in FIG. 14A is shown in FIG. 14B. In this drawing, the sealing substrate 1406 is also covered with a DLC film to prevent the penetration of oxygen.

After an insulating film 1411 is formed on the element substrate 1400, a light-emitting element 1412 composed of a cathode 1413, an organic compound layer (including a light-emitting layer) 1414, and an anode 1415 is formed on the insulating film 1411. A protecting layer 1417 is further formed on the cathode 1413 to protect the light-emitting element 1412 that is easily oxidized by oxygen and moisture. It is preferable that the insulating film is transparent or translucent to visible radiation.

The cathode 1413 and the anode 1415 are also transparent or translucent to visible radiation. Here, transparency to visible radiation means that the permeability to visible radiation is around 80 to 100% and translucency to visible radiation means that the permeability to visible radiation is around 50 to 80%. The anode 1415 and the cathode 1413 must be respectively made of a conductive oxide film with a work function of 4.5 to 5.5 and a conductive film with a work function of 2.0 to 3.5 (typically, a metal film including an element belonging to Group 1 or 2 of the periodic table). In many cases, however, the metal coat is not transparent to visible radiation, so that it is preferable that the construction shown in FIGS. 14A and 14B is used. The cathode 1413 that is translucent to visible radiation is formed by laminating a thin metal film with a thickness of 5 to 70 nm (preferably, 10 to 30 nm) and a conductive oxide film (ITO, for instance). Note that the organic compound layer (including the light-emitting layer) 1414 may adopt a well-known structure and the organic compound layer may be used alone or laminated with a carrier (electrons or holes) injecting layer, a carrier transporting layer, or a carrier blocking layer.

To prevent the degradation of the light-emitting element due to oxygen and moisture, DLC films are formed at the end portions of the display device and a dryer agent is further provided between the first substrate 1400 and the second substrate 1406. Note that the dryer agent is provided by forming a barium oxide ($BaO_2$) layer on the second substrate using an EB vapor deposition method or by sealing the dryer agent in a powder state between the substrates. Alternatively, the dryer agent may be provided to function as a spacer by mixing the dryer agent with a resin and providing the mixture on partition walls or at positions (such as on the driving circuit or wiring that connects the driving circuit to picture elements) outside light-emitting areas. Further, the dryer agent may be mixed with a resin that is the material of the partition walls. The dryer agent may be provided with any of the methods described above. Note that in this embodiment mode, powder of barium oxide is provided as the dryer agent in a space 1409 between a sealing resin 1407 and a resin 1408, as shown in FIG. 14B.

With the construction shown in FIGS. 14A and 14B, emitted light passes through the cathode and is directly observed by an observer. Most of the outside light is absorbed by an organic interlayer insulating film 1419 made of a black resin, so that the amount of the outside light reflected toward an observer is reduced to a level where no problem arises. As a result, the reflected light does not reach the observer and the outside scenes are not reflected by the surface facing the observer.

The following is a description of the method of forming DLC films at end portions of the light-emitting device produced by laminating the element substrate 1400 and the sealing substrate 1406, with reference to FIGS. 15A and 15B. A light-emitting device 1501 is held by a holding means 1502a in a reaction chamber 1500. The reaction chamber 1500 is provided with an introducing opening 1508 and an exhausting opening 1509 that respectively introduces and exhausts gas used to form DLC films. Also, means (RF electrodes) 1503 for causing plasma are provided in the reaction chamber 1500. The holding means 1502a is fixed to the reaction chamber and the light-emitting device 1501 on the holding means 1502a is pressed against the holding means 1502a by the movable holding means 1502b.

The electrodes 1503 are connected to (high-frequency) power sources 1505 and matching circuits 1504. Typical RF power sources are used as the power sources 1505. The electrodes 1503 are connected to the RF power sources 1505 that apply voltages to the electrodes 1503. A phase adjuster 1510 is provided to adjust the phases of the RF power sources 1505. With this construction, the electrodes are supplied with power, whose phases differ from each other by 180°, from the RF power sources. FIG. 15A shows a state where one pair of electrodes is provided in the reaction chamber, however, a plurality of pairs of electrodes or cylindrical electrodes may be used.

To form DLC films in end portions of the light-emitting device 1501, surfaces in the end portions need to be subjected to ion bombardment. Therefore, the holding means 1502a is connected to a power source 1507. To generate a self-bias, a capacitor 1511 is arranged between the power source 1507 and the holding means 1502a. The holding means 1502a is provided as a means for applying a bias to the substrate. Also, the holding means 1502b is provided to prevent the DLC films from being formed on the entire surface of the light-emitting device 1501. That is, the holding means 1502 functions as a mask that covers a light-emitting area and the external input terminal (FPC) to thereby prevent the DCL films from forming thereon. Note that the layer forming conditions are appropriately set by an operator of the film forming apparatus.

To form DLC films at end portions of the light-emitting device produced by laminating an element substrate and a sealing substrate, the holding means 1502a is divided into two masking portions: a masking portion (hereinafter, a light-emitting area mask) that covers the light-emitting area, and a masking portion (hereinafter, an external input terminal mask) that covers the external input terminal. These masking portions are partially connected to each other. It is preferable that the width of the connection between the light-emitting area mask and the external input terminal mask is set at 5 mm or less (see FIG. 15B). It is also preferable that the relation between the width of the connection and the height of the holding means 1502b satisfies a condition "Height/Width≧around 2" (see FIG. 15B).

Aside from the holding means composed of the light-emitting area mask and the external input terminal mask, an ordinary masking tape may be used in the CVD apparatus to cover the external input terminal to thereby prevent the formation of a DLC film thereon. To prevent the degradation of the light-emitting element due to oxygen and moisture, DLC films need to be formed in four end portions of the light-emitting device 1501. To effectively and evenly form the DLC films, a member 1506 supporting the holding means 1502a may be given a rotating function.

The holding means 1502a doubles as an electrode that applies a negative self-bias to the light-emitting device 1501. The power source 1507 applies a negative self-bias to the electrode 1502. Minute DLC films are formed in the end surfaces of the light-emitting device 1501 using a source gas accelerated by the negative self-bias voltage. Note that the source gas is an unsaturated hydrocarbon gas (such as methane, ethane, propane, or butane), an aromatic gas (such as benzene or toluene), or a halogenated hydrocarbon where at least one hydrocarbon molecular is replaced by a halogen element, such as F, Cl, or Br.

In the manner described above, DLC films 1510 with a thickness of 5 to 100 nm (preferably, 10 to 30 nm) are formed to coat the end portions of the light-emitting device. FIG. 23 shows a state where DLC films are formed on a light-emitting device using the film forming apparatus of the present invention. DLC films are directly formed on the side surfaces and edge portions of the surfaces of a substrate in this embodiment mode. However, to bring the DLC films into intimate contact, nitride films (such as silicon nitride films or silicon oxynitride films) may be formed as base films before the DLC films are formed. In this case, the thickness of the nitride films is set at 2 to 20 nm.

Embodiment 1

Figure 4:
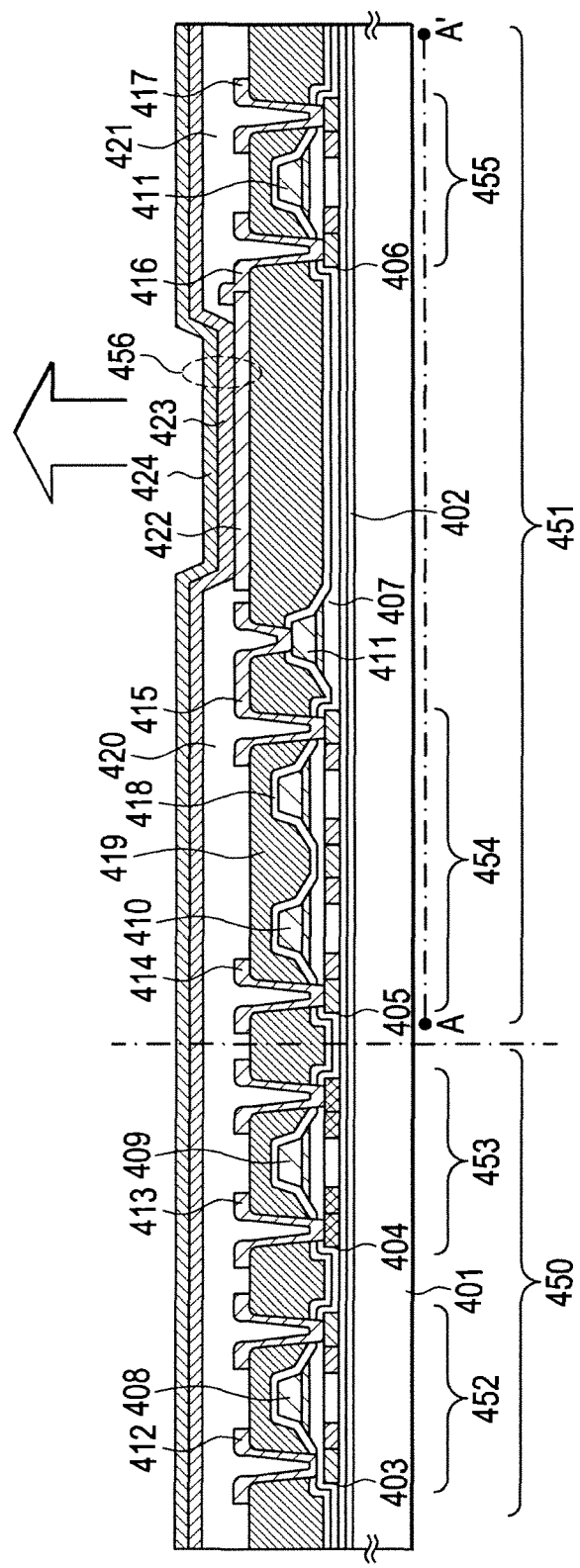
FIG. 4 is a cross to sectional view showing the constructions of the driving circuit and pixel portion of a display device.

The present invention is applicable to various types of display devices so long as the display devices use light-emitting elements. FIG. 4 shows an example of display device to which the present invention is applied. The display device in this drawing is an active matrix type display device produced using TFTs. TFTs are classified into amorphous silicon TFTs and polysilicon TFTs, depending on what materials are used to produce semiconductor films that form channel formation regions. The present invention is applicable to both types of TFTs.

It is impossible to produce an organic resin substrate, which is resistant to heat processing at 450° C. or higher, using a commercially available material. A laser anneal technique, however, makes it possible to produce polysilicon TFTs only by heating the substrate to 300° C. or below. Also, in many cases, hydrogenation processing is required to be performed during the production of polysilicon TFTs. A plasma-aided hydrogenation processing makes it possible to produce polysilicon TFTs only by heating the substrate to around 200° C.

In FIG. 4, an N-channel type TFT 452 and a P-channel type TFT 453 are formed in a driving circuit portion 450, and a switching TFT 454 and a current control TFT 455 are formed in a pixel portion 451. These TFTs are formed using various components, such as island-like semiconductor layers 403 to 406, a gate insulating film 407, and gate electrodes 408 to 411.

A substrate 401 is made of an organic resin material (such as polyimide, polyethylene terephthalate (PET), polyethylene naphthalate (PEN), polyether sulfone (PES), or aramid) to have a thickness of 30 to 120 μm (typically, 75 μm). A blocking layer 402 is made of silicon oxynitride ($SiO_xN_y$) or a silicon nitride film to have a thickness of 50 to 200 nm, thereby preventing the precipitation of oligomer or the like from the substrate 401. An interlayer insulating film includes an inorganic insulating film 418 made of silicon nitride or silicon oxynitride and an organic insulating film 419 made of acrylic or polyimide.

The driving circuit potion 450 includes a gate-signal-side driving circuit and a data-signal-side driving circuit having different circuit constructions, although the circuit constructions are not described here. The N-channel type TFT 452 and the P-channel type TFT 453 are connected to wirings 412 and 413 and are used to form a shift resister, a latch circuit, and a buffer circuit.

Figure 5A:
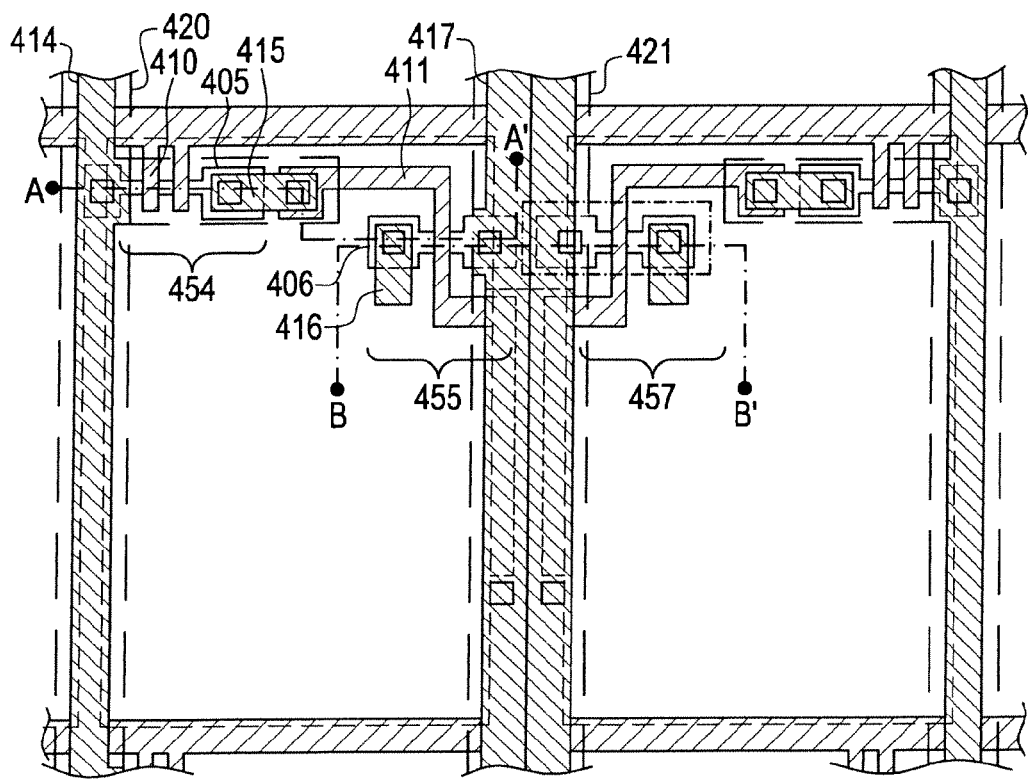
FIGS. 5A and 5B are respectively a top view and an equivalent circuit diagram showing the construction of the pixel portion of the display device.
Figure 5B:
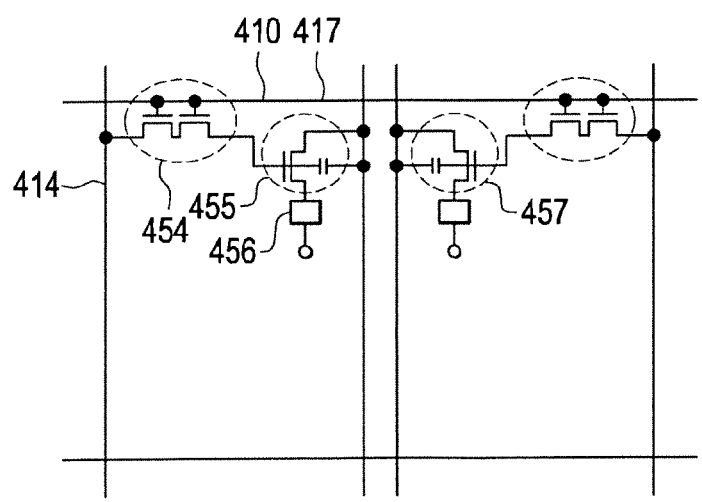

In the pixel portion 451, data wiring 414 is connected to the source of the switching TFT 454 and drain-side wiring 415 is connected to the gate electrode 411 of the current control TFT 455. Also, the source of the current control TFT 455 is connected to power source wiring 417 so as to connect a drain-side electrode 416 with the anode of the light-emitting element. FIGS. 5A and 5B each show a top view of the pixel portion constructed in this manner. For ease of explanation, the same reference numerals as in FIG. 4 are used in FIGS. 5A and 5B. Also, a cross-sectional view taken along the line A-A' in FIG. 5A is shown in FIG. 4.

As shown in FIG. 4, partition walls 420 and 421 are formed using an organic resin, such as acrylic or polyimide, or preferably a photosensitive organic resin to cover the wiring. The light-emitting element 456 is composed of an anode 422 made of ITO (indium tin oxide), an organic compound layer 423 including a luminescent material, and a cathode 424 made of MgAg, LiF, or the like. The partition walls 420 and 421 are provided to cover the end portion of the anode 422, thereby preventing shorts between the cathode and the anode.

It does not matter whether the organic compound layer is made of a low molecular material or a high molecular material. A vapor deposition method is used in the case of the low molecular material, while a spin coat method, a printing method, or an ink jet method is used in the case of the high molecular material.

A well-known high molecular material is a π-conjugated polymer material. The typical examples thereof are crystalline semiconductor film p-phenylene vinylene (PPV) derivatives, poly vinyl carbazole (PVK) derivatives, and polyfluorene derivatives. The organic compound layer made of such a material may be used alone or laminated with other layers to form a laminated structure, although a higher luminous efficiency is obtained in the latter case. Generally, the laminated structure is formed by stacking an anode, a hole injecting layer, a hole transporting layer, a light-emitting layer, and an electron transporting layer in this order. However, the laminated structure may be formed by stacking an anode, a hole transporting layer, a light-emitting layer, an electron transporting layer or a hole injecting layer, a hole transporting layer, a light-emitting layer, an electron transporting layer, and an electron injecting layer in this order. The present invention can be made with any of well-known laminated constructions. Also, the organic compound layer may be doped with a fluorescent coloring agent.

Typical materials are, for instance, disclosed in U.S. Pat. No. 4,356,429, U.S. Pat. No. 4,539,507, U.S. Pat. No. 4,720,432, U.S. Pat. No. 4,769,292, U.S. Pat. No. 4,885,211, U.S. Pat. No. 4,950,950, U.S. Pat. No. 5,059,861, U.S. Pat. No. 5,047,687, U.S. Pat. No. 5,073,446, U.S. Pat. No. 5,059,862, U.S. Pat. No. 5,061,617, U.S. Pat. No. 5,151,629, U.S. Pat. No. 5,294,869, U.S. Pat. No. 5,294,870, Japanese Patent Application Laid-open No. Hei 10-189525, Japanese Patent Application Laid-open No. Hei 8-241048, and Japanese Patent Application Laid-open No. Hei 8-78159.

It should be noted here that there are four major methods of displaying color 2.5 images. With the first method, three types of light-emitting elements each corresponding to one of R (red), G (green), and B (blue) are formed. With the second method, a light-emitting element that emits white light is combined with a color filter. With the third method, a light-emitting element that emits blue or cyan light is combined with a fluorescent member (a fluorescent color changing layer: CCM). With the fourth method, light-emitting elements each corresponding to one of R (red), G (green), and B (blue) are stacked using a transparent electrode as a cathode (an opposing electrode).

In more detail, an organic compound layer that emits red light is made of cyanopolyphenylene, an organic compound layer that emits green light is made of polyphenylenevinylene, and an organic compound layer that emits blue light is made of polyphenylenevinylene or polyalkylphenylene. Each organic compound layer is 30 to 150 nm in thickness.

Organic EL materials that can be used as a light-emitting layer are given above, although the present invention is not limited to them. Any of available combinations of materials of a light-emitting layer, a charge transporting layer, and a charge injecting layer may be freely selected. The organic compound layer in this embodiment has a construction where a light-emitting element is combined with a hole injecting layer made of PEDOT (polythiophene) or PAni (polyaniline).

The cathode 424 placed on the organic compound layer 423 is made of a material including magnesium (Mg), lithium (Li), or calcium (Ca) each having a low work function. It is preferable that an MgAg electrode (Mg:Ag=10:1) is used as the cathode 424. An MGAgAl electrode, LiAl electrode, and LiFAl electrode may also be used as the cathode 424.

It is preferred to successively form the organic compound layer 423 and the cathode 424 without leaving them in the air. This is because the condition of the interface between the cathode 424 and the organic compound layer 423 greatly effects the luminous efficiency of the light-emitting element. Note that in this specification, a light-emitting element means a light-emitting element composed of an anode (pixel electrode), an organic compound layer, and a cathode.

One laminated structure including the organic compound layer 423 and the cathode 424 is required to be formed for each picture element, but the organic compound layer 423 is extremely vulnerable to moisture. Therefore, an ordinary photolithograph technique cannot be used to form the laminated structure. Also, the cathode 424 made of an alkaline metal is easily oxidized. As a result, it is preferred to selectively form the lamination member with a vapor phase method, such as a vacuum deposition method, a sputtering method, or a plasma CVD method, using a physical mask, such as a metal mask. Note that it is possible to selectively form the organic compound layer with another method, such as an ink-jet method or a screen printing method, although it is currently impossible to successively form cathodes with these methods. As a result, it is preferable to use the vapor phase method.

Also, a protecting electrode for protecting the cathode 424 from the outside moisture and the like may be stacked on the cathode 424. It is preferable that the protecting electrode is made of a low resistant material including aluminum (Al), copper (Cu), or silver (Ag). Alternatively, the protecting electrode may be a transparent electrode. In this case, light is emitted in the direction of the arrow shown in FIG. 4 (the light emission in this direction is hereinafter referred to as a "top surface emission", for ease of explanation). In this case, by mixing a black pigment into the organic resin interlayer insulating film 419, no polarizing plate is required to form a black screen during a non-light-emission period. This protecting electrode is also expected to achieve a heat dissipation effect that lowers the temperature of the organic compound layer. It is also effective to successively form the organic compound layer 423, the cathode 424, and the protecting electrode without leaving them in the air.

In FIG. 4, the switching TFT 454 has a multi-gate construction and the current control TFT 455 is provided with an LDD overlapping the gate electrode. A TFT produced using a polysilicon operates at high speed and therefore degradation, such as hot carrier injection, tends to occur for the TFT. Therefore, TFTs are formed to have different constructions according to their functions and are provided in a pixel portion (in the case of FIG. 2, the switching TFT whose OFF current is sufficiently reduced is combined with the current control TFT that is resistant to hot carrier injection), which is highly effective in producing a display device that achieves high reliability and superior image display (high operation performance).

Figure 6:
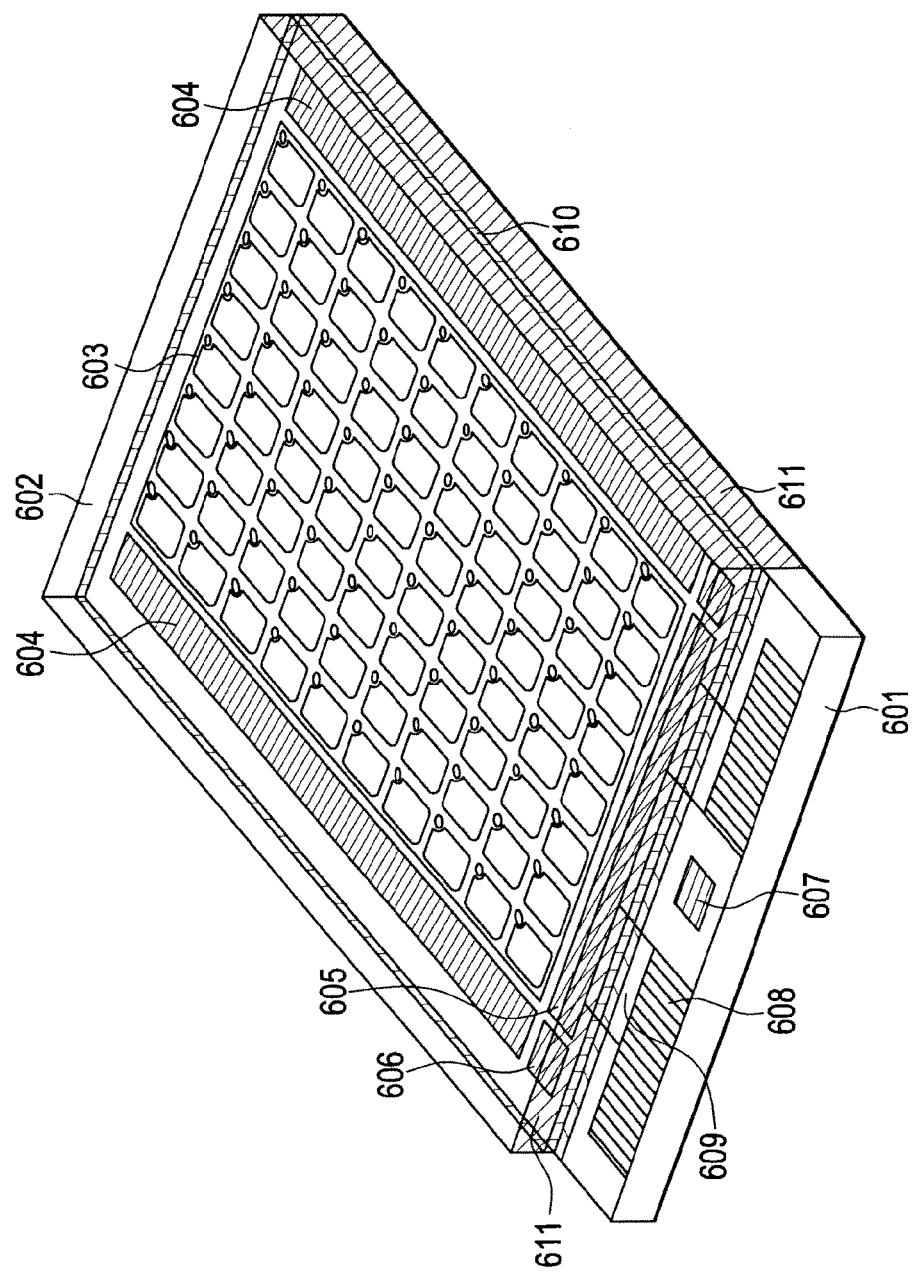
FIG. 6 is a perspective view showing the external appearance of an EL display device of the present invention.

FIG. 6 shows the external appearance of such a display device. The direction in which an image is displayed depends on the construction of the light-emitting element, although light is emitted upward to display image in this drawing. In FIG. 6, an element substrate 601, on which driving circuit portions 604 and 605 and a pixel portion 603 have been formed using TFTs, and a sealing substrate 602 are laminated using a sealing member 610. One end of the element substrate 601 is provided with an input terminal 608 via which an FPC is connected to the display device. The input terminal 608 includes a plurality of terminals that receive an image data signal, various timing signals, and electricity from an external circuit. Here, the interval between the terminals is set at 500 µm. The input terminal 608 is connected to the driving circuit portion via wiring 609. Here, an IC ship 607 on which a CPU and a memory have been formed may be mounted on the element substrate 601 using a COG (Chip on Glass) method or the like, as necessary.

A DLC film 611 is formed in end portions to prevent moisture and oxygen from entering through sealed portions and being degraded in light-emitting elements. In the case where the element substrate 601 and the sealing substrate 602 are made of an organic resin material, the DLC film may be formed to coat the entire surface of the display device, except for an input terminal, as described by referring to FIG. 1C. In this case, the input terminal is covered with a masking tape or a shadow mask prior to the formation of the DLC film.

Figure 7:
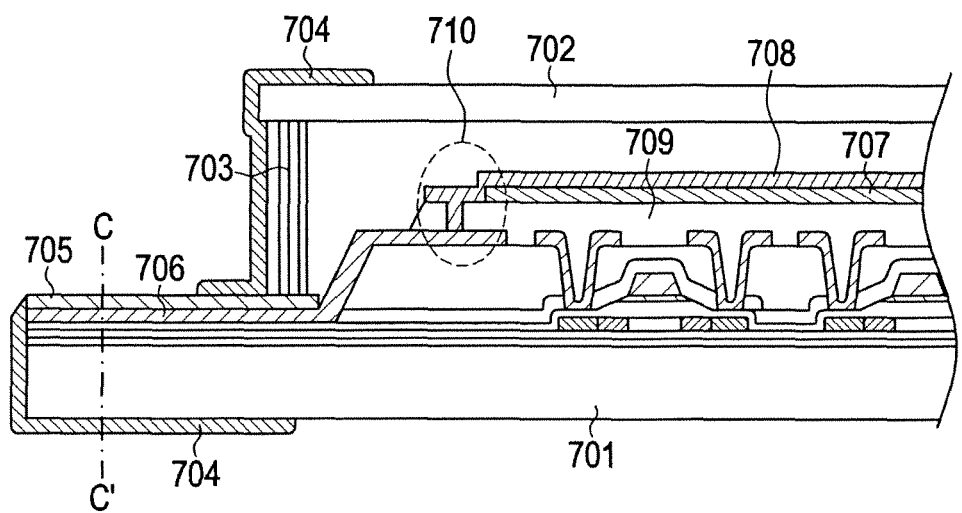
FIG. 7 shows the construction of an input terminal of the display device.
Figure 8:
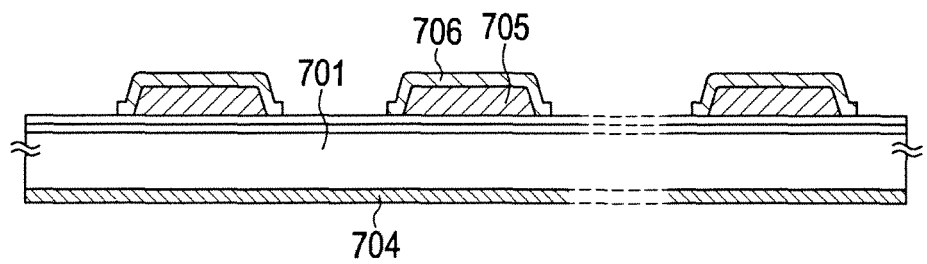
FIG. 8 shows the construction of the input terminal of the display device.

As shown in FIG. 7, the input terminal is formed by stacking an ITO 706 formed as an anode on wiring 705 made of titanium (Ti) and aluminum (Al). Incidentally, FIG. 8 is a cross-sectional view of the input terminal taken along the line C-C'. An element substrate 701 and a cover substrate 702 are laminated using a sealing member 703 and a DLC film 704 is formed to cover the sealing member 703 and the end portions of the element substrate 701 and the cover substrate 702. In the driving circuit portion, an organic compound layer 707 and a cathode 708 are formed on a partition wall 709 and a contact region 710 is formed to establish the contact between the cathode 708 and the wiring, as shown in FIG. 7.

By forming DLC films on a display device that uses an organic resin substrate, the degradation of light-emitting elements is prevented and the stability of the display device is ensured for the long term. The display device using the organic resin substrate is in particular suitable as a display device for a portable device. If the portable device is used outdoors, however, it is required to increase the reliability of the display device in consideration of the exposure to the direct sunlight, wind, and rain. The DLC films also satisfy this requirement for increasing the reliability of the display device.

Embodiment 2

Figure 9A:
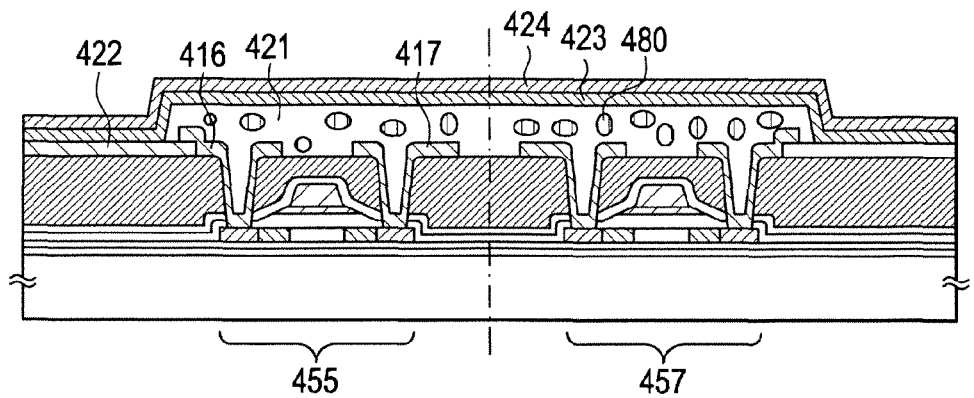
FIGS. 9A to 9C each show an example where a dryer agent is provided in the pixel portion.
Figure 9B:
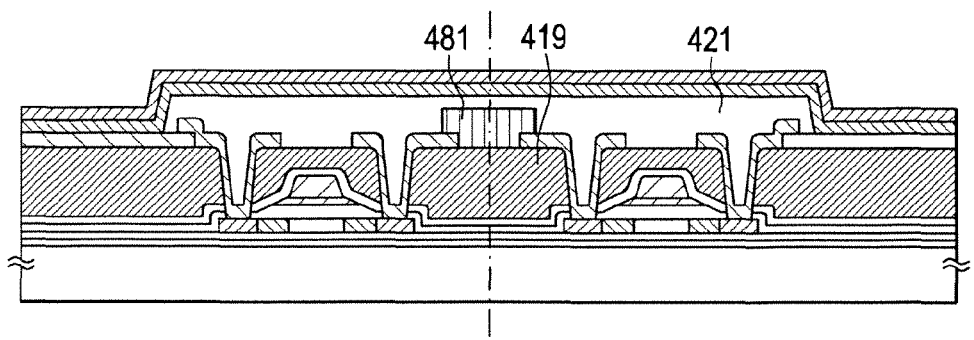
Figure 9C:
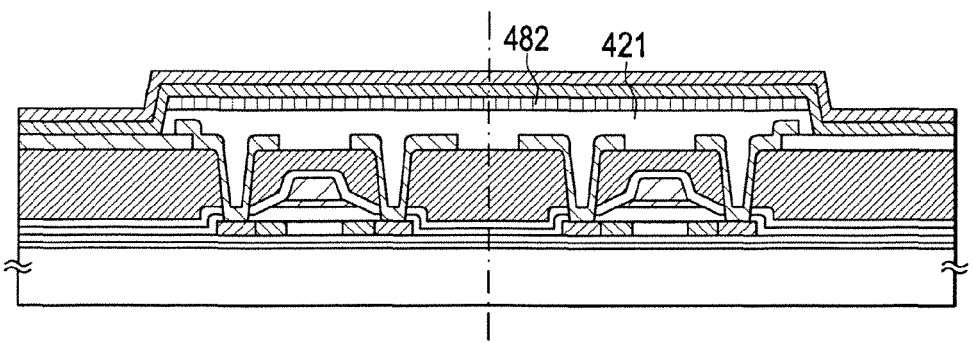

In this embodiment, the degradation of a light-emitting element is prevented using a means for sealing a dryer agent, such as barium oxide, in gaps of a light-emitting device or a space in which the light-emitting element is sealed. In FIGS. 1A to 1D, a dryer agent is provided on a driving circuit or in areas in which a sealing member has been formed. In the present embodiment, a dryer agent is provided in a different manner, as shown in FIGS. 9A to 9C. As can be seen from these drawings, a dryer agent is arranged in partition walls that are provided to separate adjacent picture elements in a pixel portion. FIGS. 9A to 9C are each a cross-sectional view taken along the line B-B' in FIG. 5. For case of explanation, the same reference numerals as in FIGS. 4, 5A, and 5B are used in FIGS. 9A to 9C.

FIG. 9A shows an example where a dryer agent 430 is dispersed in the partition wall 421. The partition wall 421 is made of a thermosetting or photosensitive organic resin material. The dryer agent is dispersed in the organic resin material prior to the polymerization of the organic resin material, and then the organic resin material including the dryer agent is applied as it is to form the partition wall 421.

FIG. 9B shows an example where a dryer agent 481 is formed on an organic resin insulating film 419. In this case, the dryer agent is formed at a predetermined position to have a predetermined pattern using a vacuum deposition method or a printing method. Then, the partition wall 421 is formed on the dryer agent 481.

FIG. 9C shows an example where a dryer agent 432 is formed on the partition wall 421. In this case, the dryer agent 482 is formed using a vacuum deposition method or a printing method, similarly to the case shown in FIG. 9B.

FIGS. 9A to 9C show examples of the formation of the dryer agent, and these examples may be combined with each other as appropriate. Also, the constructions of the present embodiment may be combined with the construction shown in FIG. 1. If the stated formations of the dryer agent are applied to the display device of Embodiment 1, a display device with high reliability is realized by the dryer agent combined with the gas barrier property of the DLC films.

Embodiment 3

Figure 10:
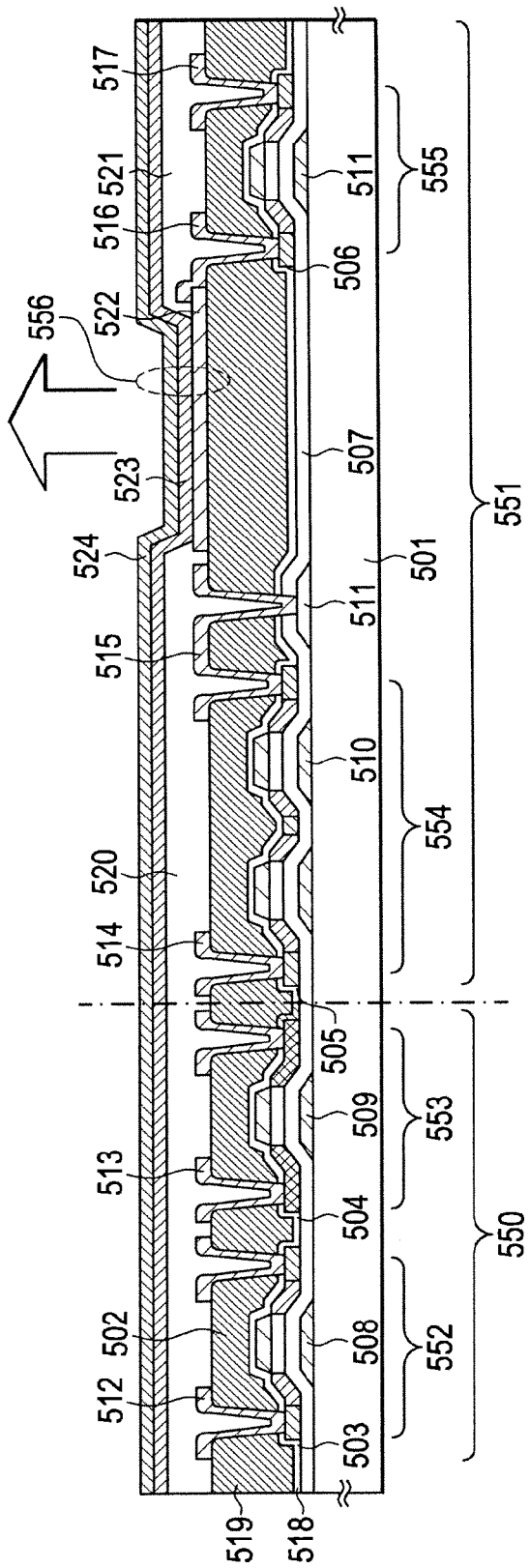
FIG. 10 is a cross-sectional view showing the constructions of the driving circuit and the pixel portion of the display device.

FIG. 10 shows an example of a display device that uses an inverted stagger type TFT. A substrate 501 and a light-emitting element 556 used in this embodiment are the same as those of Embodiment 1 and therefore are not described here.

The inverted stagger type TFT is formed by stacking the substrate 501, gate electrodes 508 to 511, gate insulating films 507, and semiconductor films 503 to 506 in this order. In FIG. 10, an N-channel type TFT 552 and a P-channel type TFT 553 are formed in a driving circuit portion 550. Also, a switching TFT 554, a current control TFT 555, and a light-emitting element 556 are formed in a pixel portion 531. An interlayer insulating film is composed of an inorganic insulating film 518 made of silicon nitride or silicon oxynitride and an organic resin film 519 made of acrylic or polyimide.

The driving circuit portion 550 includes a gate-signal-side driving circuit and a data-signal-side driving circuit having different circuit constructions, although the circuit constructions are not described here. The N-channel type TFT 552 and the P-channel type TFT 553 are connected to wiring 512 and 513 and form a shift resister, a latch circuit, and a buffer circuit.

In the pixel portion 551, data wiring 514 is connected to the source side of the switching TFT 554 and drain-side wiring 515 is connected to a gate electrode 511 of the current control TFT 555. Also, the source of the current control TFT 555 is connected to a power supplying wiring 517 so as to connect a drain-side electrode 516 to an anode of the light-emitting element.

Partition walls 520 and 521 are formed using an organic resin, such as acrylic or polyimide, or preferably a photosensitive organic resin to cover the wiring. The light-emitting element 556 is composed of an anode 522 made of ITO (indium tin oxide), an organic compound layer 523 produced using an organic EL material, and a cathode 524 made of MgAg, LiF, or the like. The partition walls 520 and 521 are provided to cover the end portion of the anode 522, thereby preventing shorts between the cathode and the anode.

Components other than the TFTs, such as the pixel portion, of the display device have the same constructions as in Embodiment 1. It is advantageous to use the inverted stagger type TFT produced using polysilicon because the manufacturing line for amorphous silicon TFTs (usually formed as inverted stagger type TFTs) can be used as it is. Needless to say, a laser anneal technique using an eximer laser makes it possible to produce polysilicon TFTs at a processing temperature of 300° C. or below.

Embodiment 4

In this embodiment, an example of construction of an electronic device using the display device of Embodiment 1 is described with reference to FIG. 11. A display device 900 in FIG. 11 includes a pixel portion 921, which is composed of picture elements 920 formed by TFTs on a substrate, and a data-signal-side driving circuit 915 and a gate-signal-side driving circuit 914 that are used to drive the pixel portion. In the example shown in FIG. 11, the data-signal-side driving circuit 915 uses a digital driving method and includes a shift register 916, latch circuits 917 and 913, and a buffer circuit 919. Also, the gate-signal-side driving circuit 914 includes various components, such as a shift register and a buffer (not shown).

In the case of VGA, the pixel portion 921 includes 640 picture elements wide by 480 picture elements high. Also, as described by referring to FIGS. 4, 5A, and 5B, a switching TFT and a current control TFT are arranged for each picture element. The light-emitting element operates as follows. When gate wiring is selected, the gate of the switching TFT opens, data signal on source wiring is accumulated in a capacitor, and the gate of the current control TFT opens. That is, data signal inputted from the source wiring causes the flow of current into the current control TFT and the light-emitting element emits light.

Figure 11:
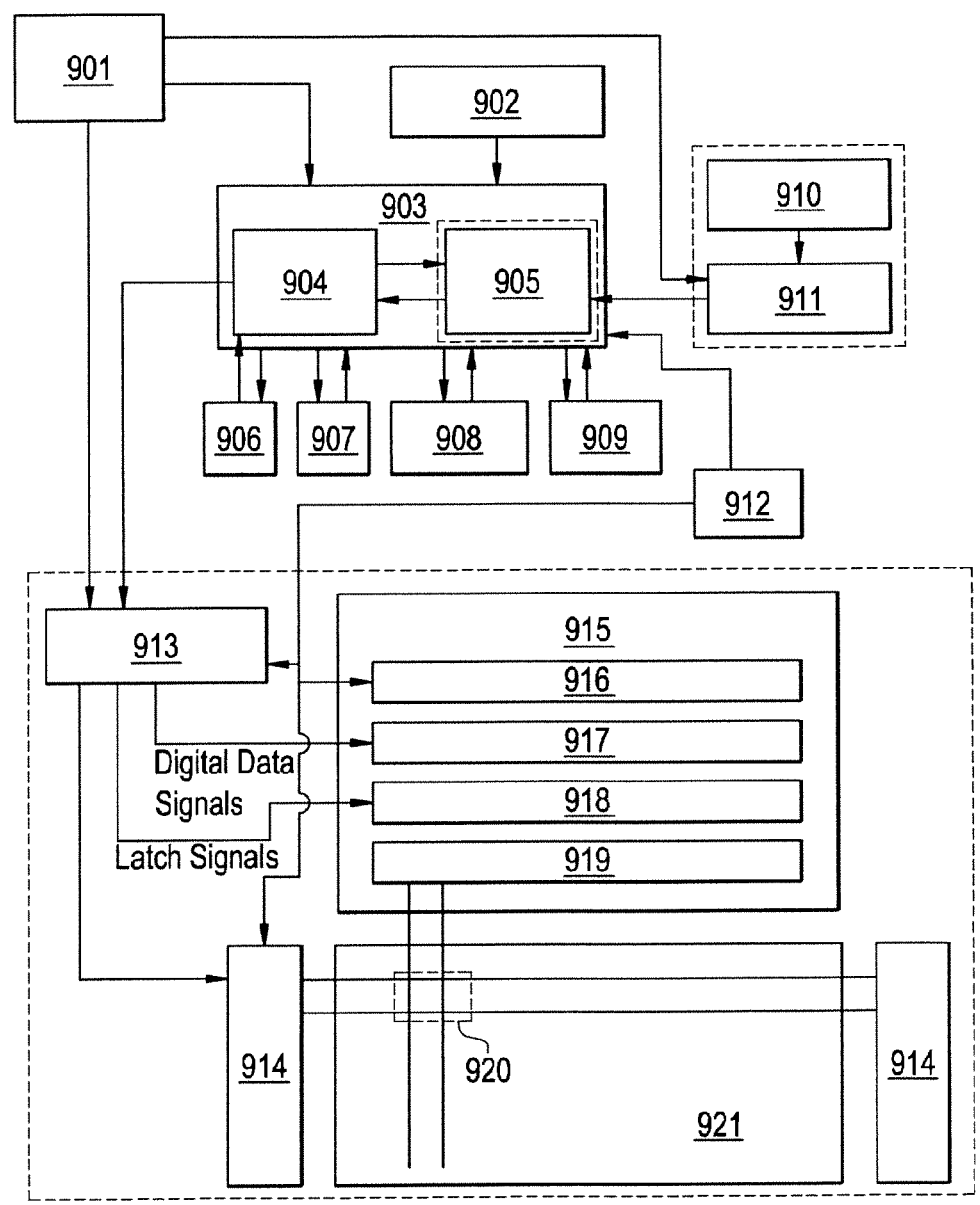
FIG. 11 is a system block diagram of an electronic device in which the display device is built.

The system block diagram shown in FIG. 11 relates to the application of the display device of Embodiment 1 to a portable information terminal, such as a PDA. The display device of Embodiment 1 includes a pixel portion 921, a gate-signal-side driving circuit 914, and a data-signal-side driving circuit 915.

An external circuit connected to the display device includes a power circuit 901 composed of a stabilized power source and a high-speed and high-precision operational amplifier, an external interface port 902 provided with a USB terminal or the like, a CPU 903, an input means composed of a pen input tablet 910 and detection circuit 911, a clock signal oscillator 912, and a control circuit 913.

The CPU 903 includes an image signal processing circuit 904 and a tablet interface 905 for receiving signals from the pen input tablet 910, and is connected to a VRAM 906, a DRAM 907, a flash memory 908, and a memory card 909.

Information processed in the CPU 903 is sent as an image signal (data signal) from the image signal processing circuit 904 to the control circuit 913. The control circuit 913 has a function of converting the image signal and a clock signal to signals which can be used corresponding to the data-signal-side driving circuit 915 and the gate-signal-side driving circuit 914, respectively.

In more detail, the control circuit 913 has a function of dividing the image signal into a plurality of pieces of data corresponding to respective picture elements. The control circuit 913 also has a function of converting a horizontal synchronizing signal and a vertical synchronizing signal inputted from the outside into two signals: a start signal used by the driving circuit, and a timing control signal required to convert the current generated by an internal power circuit into an alternating current.

It is desired that a portable information terminal, such as a PDA, can be used outdoors (in a train, for instance) for a long time using a rechargeable battery as a power supply (that is, without connecting the terminal to an AC outlet). Such an electronic device is also required to be easily portable and thus the weight and size thereof need to be reduced. The battery occupying the majority of weight of the electronic device increases in weight in accordance with the increase in battery capacity. Accordingly, various measures based on software techniques need to be used to reduce the power consumption of the electronic device. For instance, the time period in which a backlight is turned on is controlled or a standby mode is used.

In the case of the electronic device of the present embodiment, if no input signal is inputted from the pen input tablet 910 into the tablet interface 905 of the CPU 903 for a predetermined time period, the electronic device is placed in a standby mode and the components enclosed with dotted lines in FIG. 11 stop their operations in synchronization with each other. Also, the display device reduces the strength of light emitted by the light-emitting element or stops the image displaying operation. Alternatively, memories corresponding to respective picture elements may be used to change the electronic device into a still image displaying mode. With these measures, the power consumption of the electronic device is reduced.

Also, a still image may be displayed by stopping the operations of the image signal processing circuit 904 of the CPU 903 and the VRAM 906 to reduce the power consumption. In FIG. 11, the components that continue to operate even in the still image displaying mode are indicated using dotted lines. Also, as shown in FIG. 6, the control circuit 913 may be mounted on the element substrate using an IC chip with a COG method, or integrally formed in the display device.

The display device using the organic resin substrate of the present invention contributes to the weight reduction of an electronic device. If a display device whose size is five inches or the like is used for an electronic device, the weight of the electronic device becomes around 60 g with a glass substrate. However, with a display device using the organic resin substrate of the present invention, the weight of the electronic device is reduced to 10 g or less. Further, because DLC films coat the surface of the display device, the surface increases in hardness and becomes resistant to scratches or the like. As a result, the beautiful condition of the display screen is continued. As described above, the present invention achieves a superior effect for an electronic device, such as a portable information terminal.

Embodiment 5

In this embodiment, a method of forming a cathode of a light-emitting element is described with reference to FIGS.

16A to 16C. In these drawings, an insulating film 1601, an anode 1602 formed as a first electrode, an organic compound layer 1603, a cathode 1604 formed as a second electrode, and a DLC film 1605 are stacked in this order.

Figure 16A:
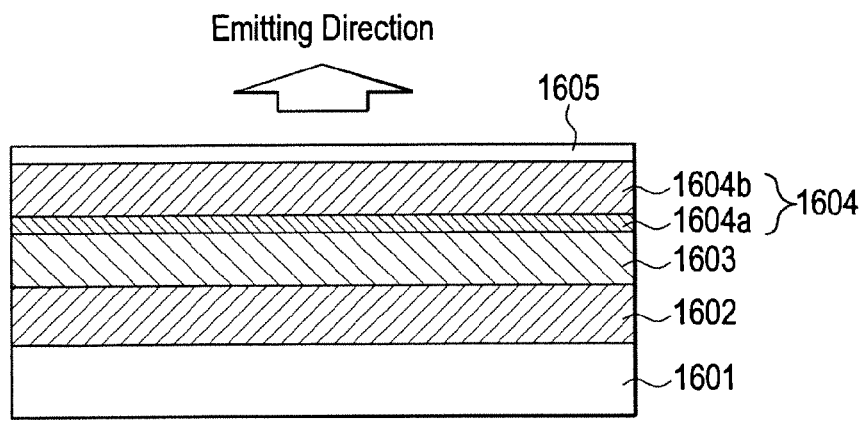
FIGS. 16A to 16C each show an example of the embodiment mode of the present invention.

First, the description is given of FIG. 16A below. In this drawing, a silicon oxide film is used as the insulating film 1601, a conductive oxide film (thickness=120 nm) formed by adding gallium oxide to zinc oxide is used as the anode 1602, and a lamination film composed of copper-phthalocyanine (a hole injecting layer) with a thickness of 20 nm and Alq$_3$ (quinolilato-aluminum complex: light-emitting layer) with a thickness of 50 nm is used as the organic compound layer 1603. The cathode 1604 has a laminated construction where a transparent electrode 1604b is stacked on a translucent electrode 1604a formed using an ultra-thin metal film. For instance, the translucent electrode 1604a is formed using an MgAg film with a thickness of 20 nm (alloy film formed by evaporating magnesium and silver) and the transparent electrode 1604b is formed using a conductive oxide film (thickness=200 nm) formed by adding gallium oxide to zinc oxide. A protecting Film 1605 is formed using a DLC film.

Figure 16B:
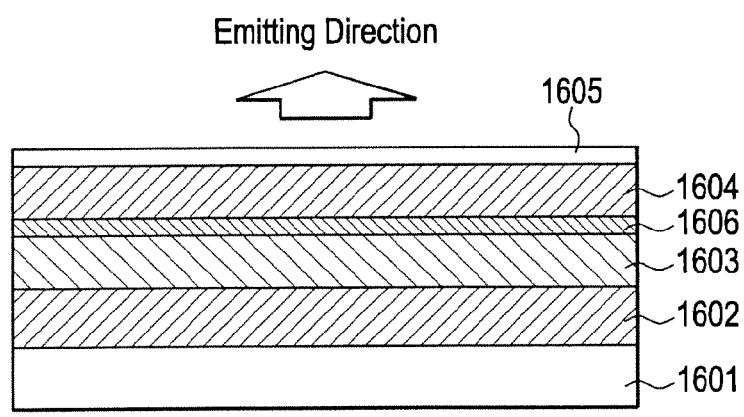

Also, in FIG. 16B, the insulating film 1601, the anode 1602, the organic compound layer 1603, and an electron injecting layer 1606 that is a LIP film are stacked in this order. The cathode 1604 that is a conductive oxide film (thickness=200 nm) formed by adding gallium oxide to zinc oxide and a protecting film 1605 formed using a DLC film are stacked on the electron injecting layer 1606.

Figure 16C:
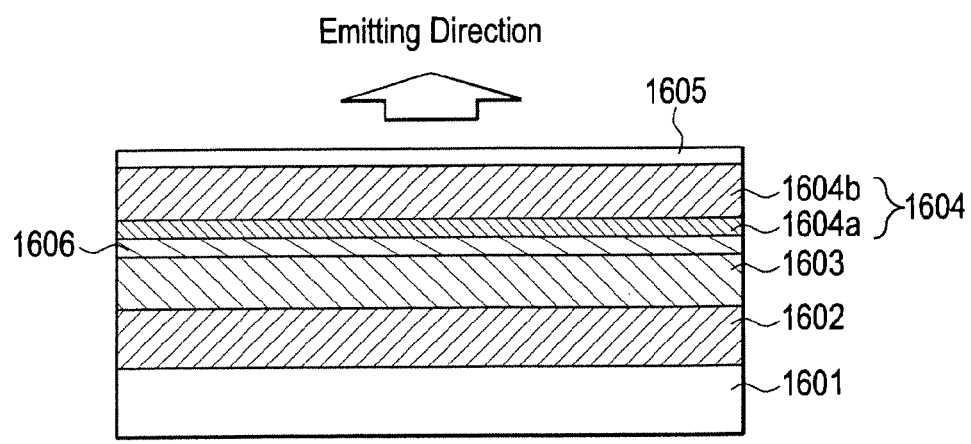

In FIG. 16C, the insulating film 1601, the anode 1602, and the organic compound layer 1603 are stacked in this order. Then an LiF film 1606 is stacked on the organic compound layer 1603 as an electron injecting layer, and the cathode 1604 is stacked on the film 1606. The cathode 1604 is composed of the translucent electrode 1604a that is an MgAg film with a thickness of 50 nm or less (preferably, 20 nm) (alloy film formed by evaporating magnesium and silver) and the transparent electrode 1604b that is a conductive oxide film (thickness=200 nm) formed by adding gallium oxide to zinc oxide. The protecting film 1605 that is formed using a DLC film is stacked on the cathode 1604.

After a light-emitting element is formed to have any one of the constructions described above, the light-emitting element is sealed and DLC films are formed at end portions with any one of the aforementioned methods. In this manner, the degradation due to oxygen and moisture is prevented.

Embodiment 6

Figure 17A:
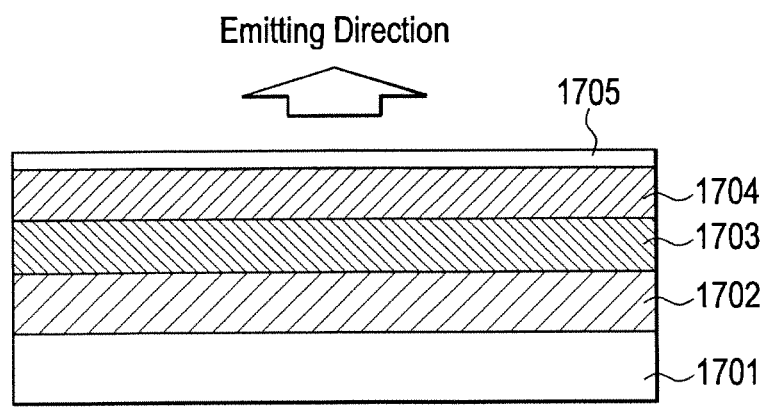
FIGS. 17A and 17B each show an example of the embodiment mode of the present invention.

In this embodiment, the cathode of a light-emitting element is formed with a method differing from that of Embodiment 1. Here, the method of forming a cathode is below described with reference to FIGS. 17A and 17B. In FIG. 17A, a cathode 1702 made of an alkaline metal (Li or Mg, for instance) with a low work function is formed on an insulating film 1701. Then, an organic compound layer 1703, an anode 1704, and a protecting layer 1705 (a DLC film) are formed on the cathode 1702.

Figure 17B:
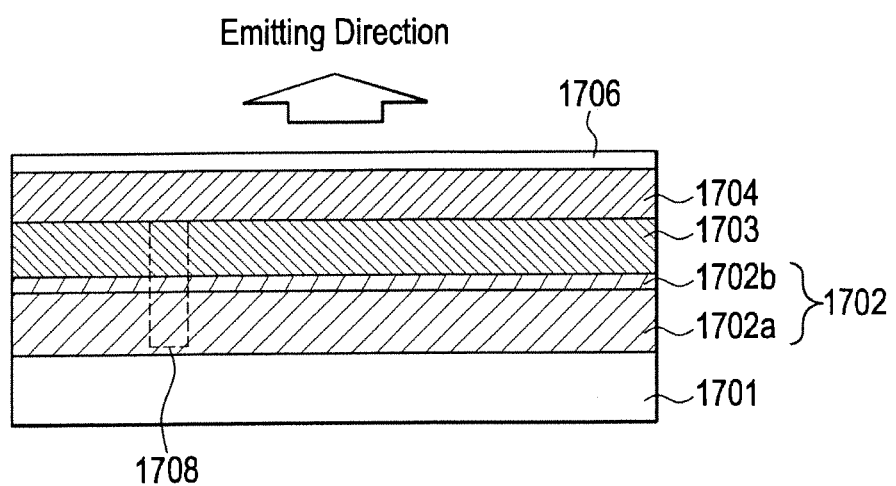

In FIG. 17B, a transparent electrode 1702a that is a transparent conductive film ITO and a translucent electrode 1702b that is an ultra-thin (thickness=50 nm or less) metal film (Al—Li alloy film or MgAg alloy film, for instance) are stacked in this order on the insulating film 1701 to form the cathode 1702. Then, the organic compound layer 1703, the anode 1704, and the protecting film 1705 that is a DLC film are formed on the cathode 1702.

Embodiment 7

In this embodiment, the organic compound layer is described in more detail. Accordingly, it is possible to combine the present embodiment with any construction of the embodiment modes and Embodiments 1 to 6. Note that in this embodiment, an anode 1801 that is a first electrode is formed using a conductive oxide film. Also, a cathode that is a second electrode is formed using a conductive film to have any of constructions described with reference to FIGS. 18A to 18D.

Figure 18A:
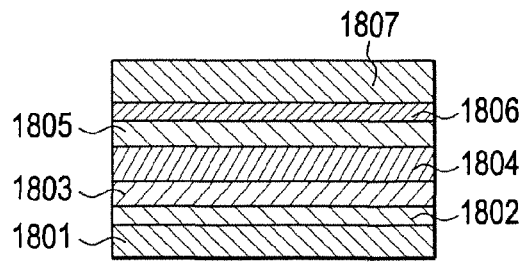
FIGS. 18A to 18D each show an example of the embodiment mode of the present invention.
Figure 18B:
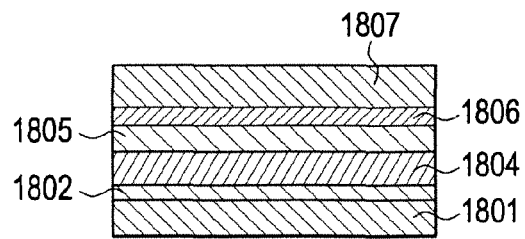
Figure 18C:
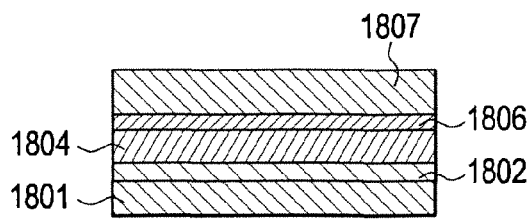
Figure 18D:
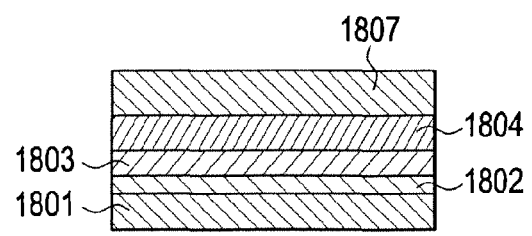

FIG. 18A shows a construction where an anode 1801, a hole injecting layer 1802, a hole transporting layer 1803, a light-emitting layer 1804, an electron transporting layer 1805, an electron injecting layer 1806, and a cathode 1807 are formed and stacked in this order. FIG. 18B shows a construction where the anode 1801, the hole injecting layer 1802, the light-emitting layer 1804, the electron transporting layer 1805, the electron injecting layer 1806, and the cathode 1807 are formed and stacked in this order. FIG. 18C shows a construction where the anode 1801, the hole injecting layer 1802, the light emitting layer 1804, the electron injecting layer 1806, and the cathode 1807 are formed and stacked in this order. FIG. 18D shows a construction where the anode 1801, the hole injecting layer 1802, the hole transporting layer 1803, the light-emitting layer 1804, and the cathode 1807 are formed and stacked in this order.

These are just a few examples of the construction of the organic compound layer and therefore there are various different constructions that can be used for the present invention. It is possible to use the stated constructions of the organic compound layer in combination with Embodiments 1 to 6.

Embodiment 8

In this embodiment, in addition to DLC films formed at end portions of a light-emitting device, a dryer agent is provided in a light-emitting element to prevent the degradation due to oxygen and moisture. This construction is described with reference to FIGS. 19A and 19B. Reference numeral 1901 represents a glass substrate that is a first substrate, and a base insulating film 1902 is formed on the first substrate 1901. An amorphous silicon layer is formed on the base insulating film 1902 and is crystallized using a well-known technique to produce a crystalline silicon film, then the crystalline silicon film is processed to have an island-like pattern, thereby forming an active layer 1904 of each TFT.

A gate insulating film (not shown), gate electrodes 1905, interlayer insulating films 1906, and pixel electrodes (first electrodes) 1907 made of an alkaline metal or an alkaline earth metal with a low work function are formed on the active layer. An organic compound layer 1908 is formed on the pixel electrodes 1907, and an anode (second electrode) 1909 is formed on the organic compound layer 1908 using a conductive oxide film (ITO film, in this embodiment) made of a compound of an indium oxide and a tin oxide.

A partition wall 1910 is formed under the organic compound layer to cover each TFT. Here, if the partition wall is made of a material produced by mixing a dryer agent with a resin, moisture existing under the protecting layer 1911 is absorbed by the partition wall and the degradation of the light-emitting element is prevented.

FIG. 19B shows another example where a resin (hereinafter, a dryer agent) 1912 mixed with a dryer agent is provided on the protective layer 1911 in the area of a driving circuit. This dryer agent 1912 also functions as a spacer. Note that the arrangement positions of the dryer agent 1912 may be freely determined so long as the agent is not arranged on input wiring or in areas in which pixel electrodes emit light. Also, the dryer agent 1912 may be provided by combining the stated arrangement methods. Further, the present embodiment may be combined with any of the constructions described in Embodiments 1 to 7.

Embodiment 9

In this embodiment, a first substrate (such as a glass substrate) 2001 is laminated with a third substrate (a film-like substrate, such us a plastic film or an ultra-thin stainless substrate) 2004 on which a light-emitting element is to be formed. After the formation of the light-emitting element, the third substrate 2004 is laminated with a second substrate 2003. Then the glass substrate 2001 is peeled off using a laser or an agent and a film-like substrate is instead laminated. This processing is described in detail below with reference to FIGS. 20A and 20B.

After the light-emitting element formed on the third substrate 2004 is sealed with the second substrate 2003, a laser light is applied onto the undersurface of the glass substrate 2001 to evaporate a bonding layer 2002 (such as polyimide, polyamide, polyimideamide, an urethane resin, a photo-curing resin, a thermosetting resin, a polychlorinated vinyl resin, an epoxy resin, an acrylic adhesive, and a gum adhesive). In this manner, the glass substrate 2001 is peeled off. In this embodiment, a linear beam is formed using the second harmonic (wavelength=532 nm) of a YAG laser and is irradiated onto the bonding layer 2002 through the glass substrate 2001. As a result, the bonding layer 2002 is evaporated and the glass substrate 2001 is peeled off.

After this, a plastic film substrate or a thin metal substrate is laminated instead of the peeled glass substrate. This realizes a flexible light-emitting device whose weight and thickness are both reduced. Note that it does not matter whether the bonding layer 2002 is laminated with the first substrate 2001 and then the third substrate 2004 or is laminated with the third substrate 2004 and then the first substrate 2001. The present embodiment may be combined with any of the embodiment modes and Embodiments 1 to 8.

Embodiment 10

In this embodiment, an organic compound layer is produced by combining an organic compound (hereinafter, a singlet compound) that emits light by a singlet exciton (singlet) and an organic compound (hereinafter, a triplet compound) that emits light by a triplet exciton (triplet). Here, the singlet compound means a compound that emits light only via a singlet excited state and the triplet compound means a compound that emits light via a triplet excited state.

Typical organic compounds that can be used as the triplet compound are described in the following theses.
(1) T. Tsutsui, C. Adachi, S. Saito, Photochemical Processes in Organized Molecular Systems, ed. K. Honda, (Elsevier Sci. Pub., Tokyo, 1991) p. 437
(2) M. A. Baldo, D. F. O'Brien, Y. You, A. Shoustikov, S. Sibley, M. E. Thompson, S. R. Rorrest, Nature 395 (1998) p. 151
*This thesis discloses an organic compound expressed by the following formula.
(3) M. A. Baldo, S. Lamansky, P. E. Burrows, M. E. Thompson, S. R. Forrest, Appl. Phys. Lett., 75 (1999) p. 4
(4) T. Tsutsui, M.-J. Yang, M. Yahiro, K. Nalamura, T. Watanabe, T. Tsuji, Y. Fukuda. T. Wakimoto, S. Mayaguchi, Jpn. Appl. Phys., 38 (12B) (1999) L1502

In addition to the luminescent materials described in the above theses, it is thought that luminescent materials (in more detail, metal complexes and organic compounds) expressed by the following molecular formulas may also be used.

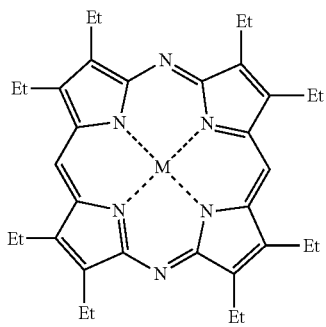

(Formula 1)

("Et" indicates ethyl group. "M" indicates an element belonging to VIII-X groups in periodic table.)

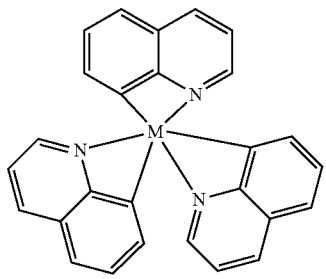

(Formula 2)

("M" indicates an element belonging to VIII-X groups in periodic table.)

In the above molecular formulas, M is an element belonging to Group 3, 9, or 10 of the periodic table. In the above theses, platinum and iridium are used. However, the inventors of the present invention consider that it is preferable to use nickel, cobalt, or palladium because these materials are inexpensive compared with platinum and iridium and therefore suitable for reducing the cost of fabricating light-emitting devices. It is thought that nickel is in particular preferable because nickel complexes are easy to form and thus the productivity is increased.

The triple compound has a higher luminous efficiency than the singlet compound and it is possible to reduce an operating voltage (voltage required to have a light-emitting element emit light) without reducing the amount of emitted light and brightness. This embodiment is made using this feature.

If a low-molecular organic compound is used as a light-emitting layer, the life span of a light-emitting layer that emits red light is shorter than those of light-emitting layers that emit other colored lights under present circumstances. This is because the luminous efficiency of the red-light-emitting layer is lower than those of the other-colored-light-emitting layers and the operating voltage thereof is required to be increased to obtain the same brightness as those of the other-colored-light-emitting layers. This promotes the degradation of the red-light-emitting layer.

In this embodiment, however, a triplet compound having a high luminous efficiency is used as the red-light-emitting layer, so that the operating voltage thereof does not be required to be increased to obtain the same brightness as those of the light-emitting layers that emit green and blue lights. Accordingly, a situation is avoided where the degradation of the red-light-emitting-element is extremely accelerated. As a result, it becomes possible to display color images without causing problems, such as color deviations. The reduced operating voltage is also preferable because it becomes unnecessary for transistors to have high withstand voltages.

It should be noted here that the triplet compound is used as the light-emitting layer that emits red light in this embodiment, although the triplet compound may also be used as the light-emitting layer that emits green light or the light-emitting layer that emits blue light.

In the case of RGB color display, three types of light-emitting elements that respectively emit red light, green light, and blue light need to be provided in a pixel portion. In this case, it is possible to use the triplet compound for the light-emitting element that emits red light and use the singlet compound for other light-emitting elements.

By selectively using the triplet compound and the singlet compound in this manner, it becomes possible to have each light-emitting element operate at the same operating voltage (10V or less, preferably 3 to 10V). Accordingly, all power sources for the light-emitting device can have the same voltage (3V or 5V), which allows circuit design to be carried out without difficulty. Note that the construction described in this embodiment may be combined with any of the constructions of Embodiments 1 to 6.

Embodiment 11

A light-emitting device formed by implementing the present invention can be incorporated to various electric-equipment, and a pixel portion is used as an image display portion. Given as such electronic equipment of the present invention are cellular phones, PDAs, electronic books, video cameras, notebook computers, and image play back devices with the recording medium, for example, DVD (digital versatile disc), digital cameras, and the like. Specific examples of those are shown in FIGS. 12A to 13D.

Figure 12A:
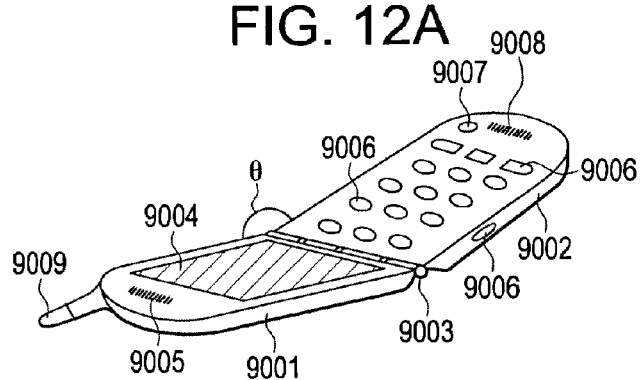
FIGS. 12A to 12E each show an example of the electronic device.

FIG. 12A shows a cellular phone, which is composed of a display panel 9001, an operation panel 9002, and a connecting portion 9003. The display panel 9001 is provided with a display device 9004, an audio output portion 9005, an antenna 9009, etc. The operation panel 9002 is provided with operation keys 9006, a power supply switch 9002, an audio input portion 9008, etc. The present invention is applicable to the display device 9004.

Figure 12B:
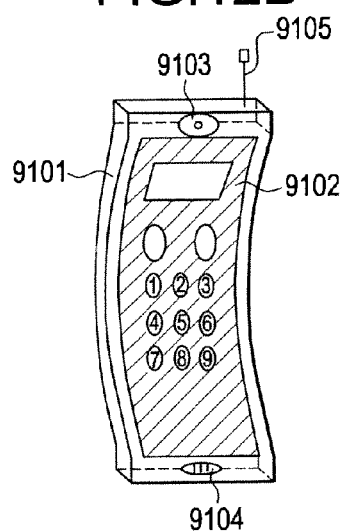

FIG. 12B also shows a cellular phone, which is composed of a main body or a housing 9101, a display device 9102, an audio output portion 9103, an audio input portion 9104, and an antenna 9105. The display device 9102 can be provided with a touch sensor so as to operate buttons on the display. By using the organic resin substrate of the present invention, the substrate can be bent after the completion of the display device. Therefore, while such characteristics are used, the housing with 3 dimensional curving surfaces, which is designed based on the human engineering can be employed by the display device without difficulty.

Figure 12C:
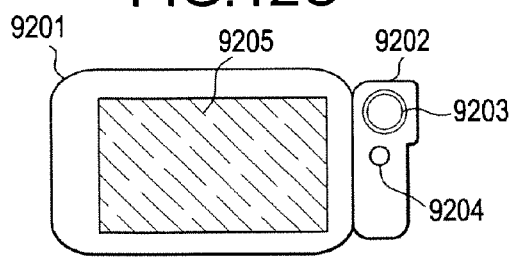

FIG. 12C shows a mobile computer, or a portable information terminal, which is composed of a main body 9201, a camera portion 9202, an image receiving portion 9203, operation switches 9204, and a display device 9205. The present invention can be applied to the display device 9205. In such electronic devices, the display device of 3 to 5 inches is employed, however, by employing the display device of the present invention, the reduction of the weight in the portable information terminal can be attained.

Figure 12D:
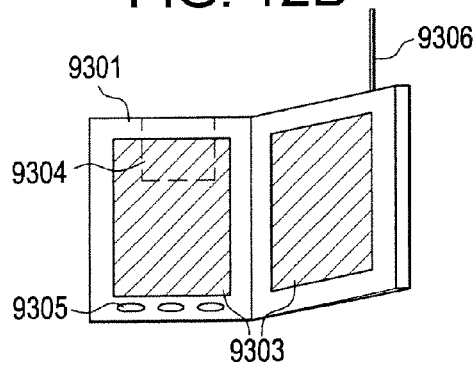

FIG. 12D shows a portable book, which is composed of a main body 9301, display devices 9303, and a recording medium 9304, an operation switch 9305, and an antenna 9306, and which displays the data recorded in MD or DVD and the data received by the antenna. The present invention can be applied to the display devices 9302. In the portable book, the display device of the 4 to 12 inches is employed. However, by employing the display device of the present invention, the reduction of the weight and thickness in the portable book can be attained.

Figure 12E:
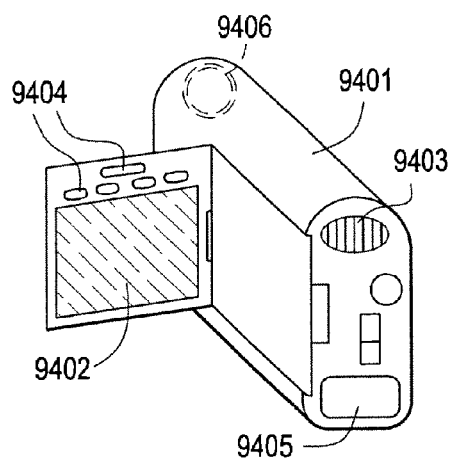

FIG. 12E shows a video camera, which is composed of a main body 9401, a display device 9402, an audio input portion 9403, operation switches 9404, a battery 9405, and the like. The present invention can be applied to the display device 9402.

Figure 13A:
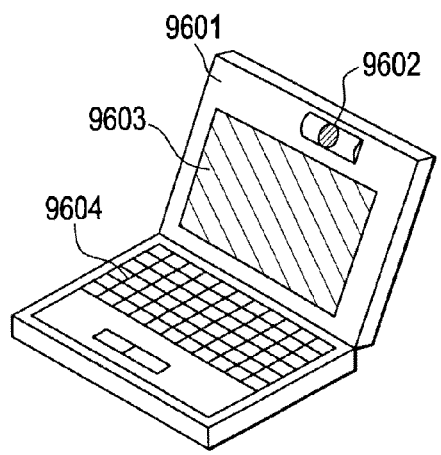
FIGS. 13A to 13D each show an example of the electronic device.

FIG. 13A shows a personal computer, which is composed of a main body 9601, an image input portion 9602, a display device 9603, and a key board 9604. The present invention can be applied to the display device 9601.

Figure 13B:
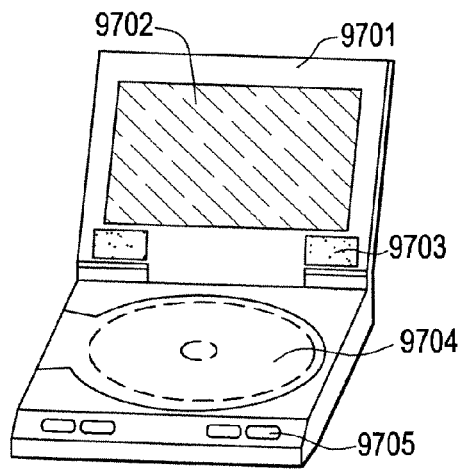

FIG. 13B shows a player employing a recording medium with programs recorded thereon (hereinafter referred to as recording medium), which is composed of main body 9701, a display device 9702, a speaker portion 9703, a recording medium 9704, and an operation switch 9705. The device employs DVD (digital versatile disc), CD, etc. as the recording medium so that music can be listened, movies can be seen and games and interne can be done. The present invention can be applied to the display device 9702.

Figure 13C:
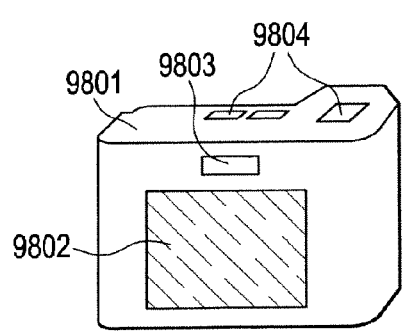

FIG. 13C shows a digital camera, which is composed of a main body 9801, a display device 9802, an eyepiece portion 9803, an operation switch 9804, and an image receiving portion (not shown). The present invention can be applied to the display device 9802.

Figure 13D:
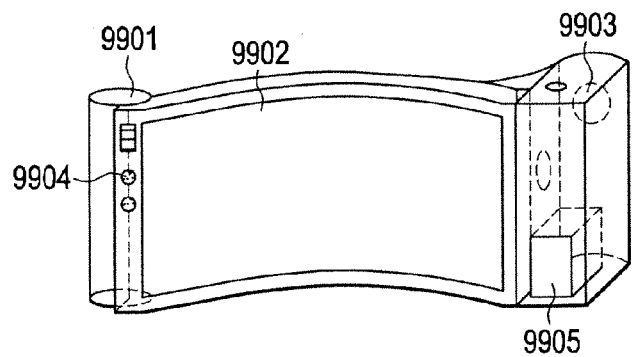

FIG. 13D also shows a digital camera, which is composed of a main body 9901, a display device 9902, an image receiving portion 9903, an operation switch 9904, a battery 9905, etc. The present invention can be applied to the display device 9902. By using the organic resin substrate of the present invention, the substrate can be bent after the completion of the display device. Therefore, while such characteristics are used, the housing with 3 dimensional curving surfaces, which is designed based on the human engineering can be employed by the display device without difficulty.

The display device of the present invention is employed in the cellular phones in FIGS. 12A and 12B, the mobile computer or the portable information terminal in FIG. 12C, the portable book in FIG. 12D, and the personal computer in FIG. 13A. The display device can reduce the power consumption of the above device by displaying white letters on the black display in a standby mode.

In the operation of the cellular phones shown in FIGS. 12A and 12B, luminance is lowered when the operation keys are used, and the luminance is raised after usage of the operation switch, whereby the low power consumption can be realized. Further, the luminance of the display device is raised at the receipt of a call, and the luminance is lowered during a call, whereby the low power consumption can be realized. Besides, in the case where the cellular phone is continuously used, the cellular phone is provided with a function of turning off a display by time control without resetting, whereby the low power consumption can be realized. Note that the above operations may be conducted by manual control.

Figure 21A:
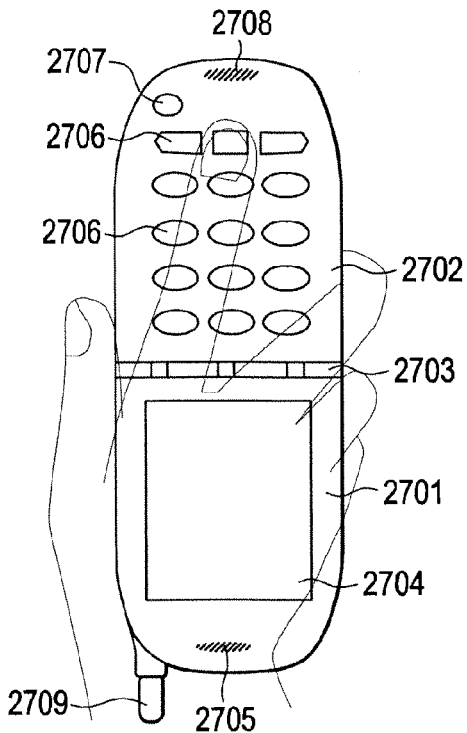
FIGS. 21A to 21C each show an example of the electronic device that uses a light-emitting device as its display unit.
Figure 21B:
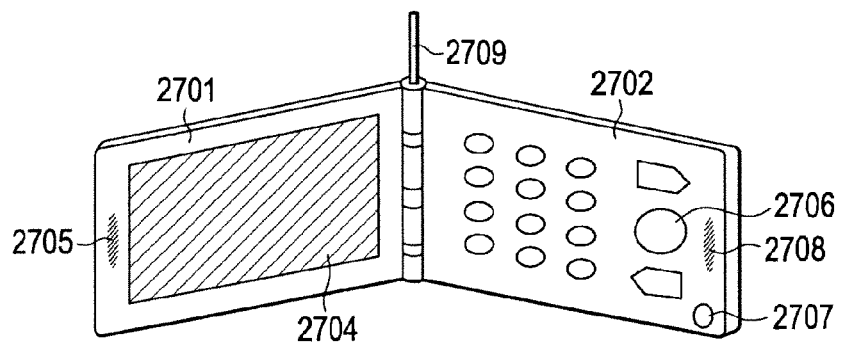

FIGS. 21A and 21B show cellular phones. Reference numeral 2701 denotes a display panel, and reference numeral 2702 denotes an operation panel. The display panel 2701 and the operation panel 2702 are connected in the connection portion 2703. The cellular phone has a display portion 2704, an audio output portion 2705, operation keys 2706, a power supply switch 2707, and an audio input portion 2708. The present invention can be applied to the display portion 2704.

FIGS. 21A and 21B show the lengthwise cellular phone and the widthwise cellular phone, respectively.

Figure 21C:
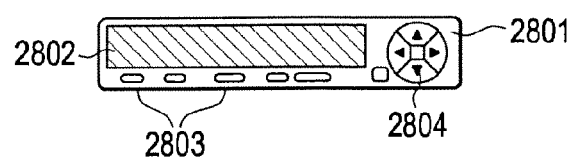
Figure 22:
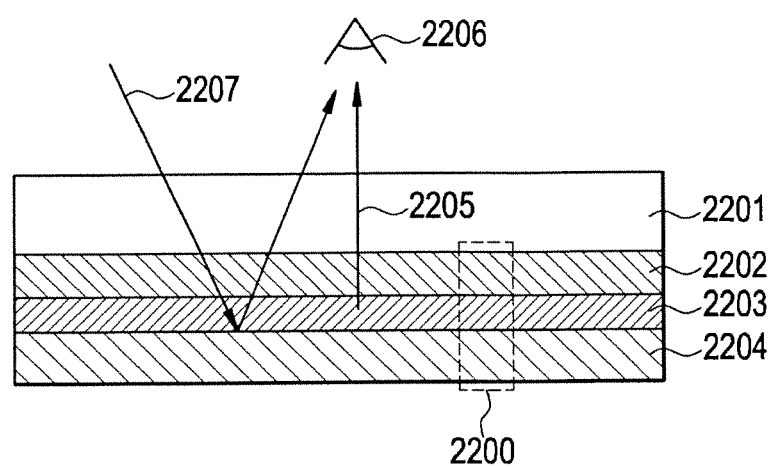
FIG. 22 shows an example of the conventional technique.
Figure 23A:
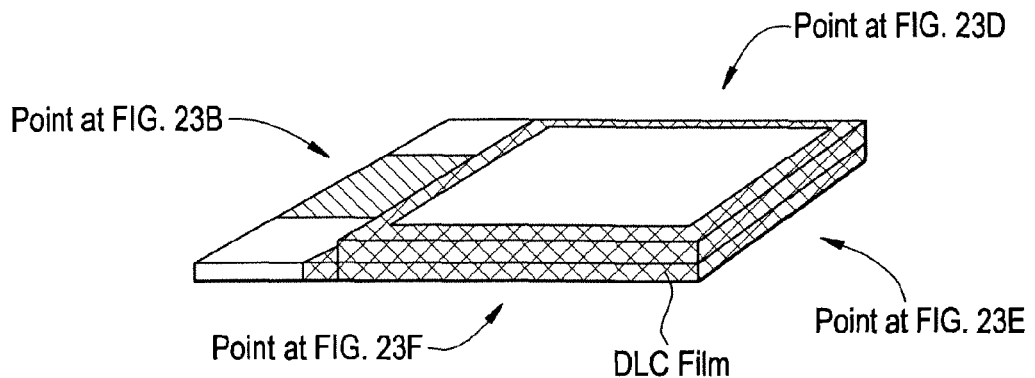
FIGS. 23A to 23E each show an example of the embodiment mode of the present invention.
Figure 23B:
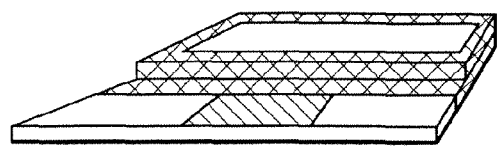
Figure 23C:
Figure 23D:
Figure 23E:
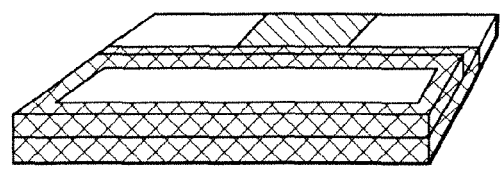

FIG. 21C shows a car audio system, which is composed of a main body 2801, a display portion 2802, and operation switches 2803 and 2304. The light-emitting device of the present invention can be applied to the display portion 2802. In this embodiment the car audio system for being mounted in a car is shown. However, it can be applied to the standstill car audio. The display portion 2304 can reduce the power consumption by displaying white letters in the black display.

Further, it is effective to incorporate an optical sensor and to provide a function of modulating emission luminance in accordance with brightness in a usage environment by providing means for detecting the brightness in the usage environment. A user can recognize image or character information without problems if brightness of 100 to 150 in contrast ratio in comparison with the brightness of the usage environment is secured. That is, it is possible that the luminance of an image is raised in the bright usage environment to make the image easy to see while the luminance of an image is suppressed in the dark usage environment to thereby suppress the power consumption.

Although it is not shown here, the present invention can be applied to the display device which is employed in a navigation system, a refrigerator, a washing machine, a micro-wave oven, a telephone, a fax machine, etc. As described above, the applicable range of the present invention is so wide that the present invention can be applied to various products.

According to the present invention described above, in a display device that uses an organic resin substrate, DLC films are formed on the outer surfaces of a sealing member and an outer surface or end portions of the organic resin substrate. This construction improves the gas barrier property of the display device and prevents the degradation of light-emitting elements. Also, if a DLC film is formed on a light incident surface, ultraviolet rays are blocked, the light chemical reaction of the organic resin substrate is suppressed, and the degradation of the organic resin substrate is prevented.

Such a display device realizes an electronic device whose weight is reduced and shock resistance is improved. Also, the surface on which a DLC film has been formed is hardened, so that the surface of an organic resin substrate becomes resistant to flaws. As a result, a high-quality display screen is achieved and remains clear for a long time.

By forming a DLC film to cover end portions of substrates, from entering oxygen and moisture through between the substrates is prevented. This achieves the prolonged life spans of light-emitting elements and a light-emitting device. Also, by providing a DLC film to cover the entire surface except for an area in which light emission is performed, it becomes unnecessary to strictly control the formation of the DLC film. Further, by forming an interlayer insulating film using a black resin, the reflection of light by the first substrate is prevented. As a result, a problem in that outside scenes, such as the face of an observer, is reflected by a light-emitting device is solved without using an expensive circular polarizing film.

What is claimed is:

1. An electronic equipment comprising:
a main body including a display surface; and
an active matrix type display device incorporated into the main body so as to display an image on the display surface,
wherein the active matrix type display device includes an organic electro-luminescent material between a first substrate and a second substrate,
wherein an outer surface of the electronic equipment is concavely curved, and
wherein the first substrate and the second substrate are curved along the curved outer surface of the electronic equipment.

2. The electronic equipment according to claim 1, wherein the electronic equipment is one of a cellular phone and a digital camera.

3. The electronic equipment according to claim 1, wherein the first substrate and the second substrate are an organic resin substrate.

4. The electronic equipment according to claim 1, wherein a back side of the main body opposed to the display surface is curved.

5. The electronic equipment according to claim 1, wherein the outer surface of the electronic equipment is curved in a longitudinal direction.

6. The electronic equipment according to claim 1, wherein each of the first substrate and the second substrate comprises aramid.

7. An electronic equipment comprising:
a main body including a display surface;
an active matrix type display device incorporated into the main body so as to display an image on the display surface; and
a touch sensor so that a user operates buttons on the display surface,
wherein the active matrix type display device includes an organic electro-luminescent material between a first substrate and a second substrate,
wherein an outer surface of the electronic equipment is concavely curved, and
wherein the first substrate and the second substrate are curved along the curved outer surface of the electronic equipment.

8. The electronic equipment according to claim 7, wherein the electronic equipment is one of a cellular phone and a digital camera.

9. The electronic equipment according to claim 7, wherein the first substrate and the second substrate are an organic resin substrate.

10. The electronic equipment according to claim 7, wherein a back side of the main body opposed to the display surface is curved.

11. The electronic equipment according to claim 7, wherein the outer surface of the electronic equipment is curved in a longitudinal direction.

12. The electronic equipment according to claim 7, wherein each of the first substrate and the second substrate comprises aramid.

13. An electronic equipment comprising:
an active matrix type display device incorporated into the electronic equipment,
wherein the active matrix type display device includes an organic electro-luminescent material between a first substrate and a second substrate,
wherein an outer surface of the electronic equipment is concavely curved,
wherein the organic electro-luminescent material emits light through the outer surface of the electronic equipment, and
wherein the first substrate and the second substrate are curved along the curved outer surface of the electronic equipment.

14. The electronic equipment according to claim 13, wherein the electronic equipment is a digital camera.

15. The electronic equipment according to claim 13, wherein the first substrate and the second substrate are an organic resin substrate.

16. The electronic equipment according to claim 13, wherein a back side of the electronic equipment opposed to the outer surface is curved.

17. The electronic equipment according to claim 13, wherein the outer surface of the electronic equipment is curved in a longitudinal direction.

18. The electronic equipment according to claim 13, wherein each of the first substrate and the second substrate comprises aramid.

19. A cellular phone comprising:
an active matrix type display device incorporated into the cellular phone,
wherein the active matrix type display device includes an organic electro-luminescent material between a first substrate and a second substrate,
wherein an outer surface of the cellular phone is concavely curved,
wherein the organic electro-luminescent material emits light through the outer surface of the cellular phone, and
wherein the first substrate and the second substrate are curved along the curved outer surface of the cellular phone.

20. The cellular phone according to claim 19, wherein the first substrate and the second substrate are an organic resin substrate.

21. The cellular phone according to claim 19, wherein a back side of the cellular phone opposed to the outer surface is curved.

22. The cellular phone according to claim 19, wherein the outer surface of the cellular phone is curved in a longitudinal direction.

23. The cellular phone according to claim 19, wherein each of the first substrate and the second substrate comprises aramid.

* * * * *

UNITED STATES PATENT AND TRADEMARK OFFICE
CERTIFICATE OF CORRECTION

PATENT NO. : 8,735,899 B2  
APPLICATION NO. : 13/612986  
DATED : May 27, 2014  
INVENTOR(S) : Yamazaki et al.

Page 1 of 1

It is certified that error appears in the above-identified patent and that said Letters Patent is hereby corrected as shown below:

In the Specification

Column 2, line 63, "self-Light" should read --self-light--.

Column 3, line 40, "resistance;" should read --resistance,--.

Column 6, line 21, "art" should read --an--.

Column 7, line 1, "213" should read --215--.

Column 11, line 67, "color 2.5 images" should read --color images--.

Column 14, line 14, "case" should read --ease--.

Column 14, line 17, "430" should read --480--.

Column 14, line 30, "432" should read --482--.

Column 14, line 55, "531" should read --551--.

Column 15, line 36, "913" should read --918--.

Column 17, line 20, "Film" should read --film--.

Column 17, line 23, "LIP film" should read --LiF film--.

Column 19, line 8, "us" should read --as--.

Column 19, line 62, "Y. Fukuda." should read --Y. Fukuda,--.

Column 20, line 36, "Group 3" should read --Group 8--.

Column 22, line 19, "main" should read --a main--.

Column 22, line 24, "interne" should read --internet--.

Column 23, line 5, "2304" should read --2804--.

Column 23, line 9, "2304" should read --2804--.

Signed and Sealed this  
Sixteenth Day of December, 2014

Michelle K. Lee  
*Deputy Director of the United States Patent and Trademark Office*